United States Patent
Imai et al.

(10) Patent No.: US 6,946,234 B2
(45) Date of Patent: Sep. 20, 2005

(54) POSITIVE SENSITIVE RESIN COMPOSITION AND A PROCESS FOR FORMING A RESIST PATTERN THEREWITH

(75) Inventors: Genji Imai, Kanagawa (JP); Ritsuko Fukuda, Kanagawa (JP); Toshiro Takao, Kanagawa (JP); Keiichi Ikeda, Kanagawa (JP); Yoshihiro Yamamoto, Kanagawa (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/627,891

(22) Filed: Jul. 28, 2003

(65) Prior Publication Data

US 2004/0081914 A1 Apr. 29, 2004

Related U.S. Application Data

(62) Division of application No. 09/418,368, filed on Oct. 14, 1999, now Pat. No. 6,630,285.

(30) Foreign Application Priority Data

| Oct. 15, 1998 | (JP) | ............................................ | 10-294281 |
| Jul. 1, 1999 | (JP) | ............................................ | 11-187328 |
| Jul. 1, 1999 | (JP) | ............................................ | 11-187329 |
| Jul. 1, 1999 | (JP) | ............................................ | 11-187330 |

(51) Int. Cl.$^7$ ............................................ G03C 1/492
(52) U.S. Cl. ............................ 430/270.1; 430/288.1; 430/326
(58) Field of Search ........................ 430/270.1, 288.1, 430/326

(56) References Cited

U.S. PATENT DOCUMENTS

| 4,696,886 A | 9/1987 | Hanabata et al. |
| 5,079,129 A | 1/1992 | Roth et al. |
| 5,364,738 A | 11/1994 | Kondo et al. |
| 5,496,678 A | 3/1996 | Imai et al. |
| 5,556,734 A | 9/1996 | Yamachika et al. |
| 6,156,477 A | 12/2000 | Motomi et al. |

Primary Examiner—Cynthia Hamilton
(74) Attorney, Agent, or Firm—Buchanan, Ingersoll P.C.

(57) ABSTRACT

A pattern can be precisely formed by irradiating, with an active energy beam, a positive sensitive resin composition according to this invention comprising a base polymer, an ether-bond-containing olefinic unsaturated compound and an acid-generating agent, where the base polymer is a copolymer comprising the structural units represented by formulas (1) to (3):

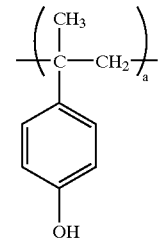

(1)

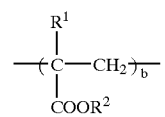

(2)

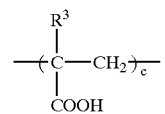

(3)

where $R^1$ and $R^3$ are each independently hydrogen or methyl and $R^2$ is $C_1$–$C_6$ straight or branched unsubstituted alkyl or $C_1$–$C_6$ straight or branched substituted alkyl, wherein a, b and c are 0.05 to 0.7, 0.15 to 0.8 and 0.01 to 0.5, respectively and a+b+c=1.

21 Claims, 5 Drawing Sheets

POSITIVE SENSITIVE RESIN COMPOSITION AND A PROCESS FOR FORMING A RESIST PATTERN THEREWITH

This application is a divisional of application Ser. No. 09/418,368, filed on Oct. 14, 1999 now U.S. Pat. No. 6,630,285.

BACKGROUND OF THE INVENTION

1. Field of the Invention

This invention relates to a positive sensitive resin composition comprising a novel copolymer of 4-(1-methylethenyl)phenol, a (meth)acrylate and a (meth)acrylic acid (PIPE copolymer), an ether-bond-containing olefinic unsaturated compound and an acid-generating agent, as well as a process for forming a resist pattern therewith. In particular, it relates to a positive sensitive resin composition comprising a copolymer of 4-(1-methylethenyl)phenol, a (meth)acrylate and a (meth)acrylic acid useful as a base polymer, an ether-bond-containing olefinic unsaturated compound and an acid-generating agent, as well as a process for forming a resist pattern by applying or adhering the composition to a substrate and then irradiating it with an active energy beam such as ultraviolet rays, visible light and heat rays for developing it.

2. Description of the Related Art

A resist material in combination with an exposure technique has been utilized in lithography such as patterned circuit formation in an electron device and printing.

An application of such patterned circuit formation in an electron device may be, for example, a process for manufacturing a color filter for a variety of multicolored liquid-crystal color displays such as a liquid-crystal color television.

Such a color filter has been conventionally manufactured by, for example, screen printing and electrodeposition. However, as a color display has been improved for its resolution, it has been more important to refine a pattern. Thus, a variety of patterning processes utilizing photolithography has been investigated.

For example, JP-A 8-94827 has disclosed a process for manufacturing a color filter comprising the steps of [1] forming a transparent conductive layer on a transparent substrate; [2] forming a positive photosensitive coating layer; [3] exposing a part of the transparent conductive layer; [4] forming a colored area by electrodeposition; and [5] repeating the steps [3] and [4] as required. Of these steps, a pattern refinement level depends on the steps [2] and [3], in which photolithography is used. In particular, it significantly depends on a positive photosensitive composition applied on the transparent conductive layer. The above invention employs a positive photosensitive composition essentially comprising (a) a polymer containing both carboxyl and hydroxyphenyl groups in one molecule, (b) a compound containing two or more vinyl ether groups in one molecule, and (c) a compound generating an acid by irradiating an active energy beam.

This photosensitive composition is developed as follows; by heating the film on which the positive photosensitive composition has been applied, an addition reaction of the carboxyl group and/or hydroxyphenyl group with the vinyl ether group forms a crosslink, which is insoluble to a solvent or an alkali developing solution, and then, after irradiating with an active energy beam and then, as necessary, heating the film, an acid generated in the irradiated area acts as a catalyst to cleave the crosslink structure and thus to again make the irradiated area soluble to a solvent or an alkali developing solution. For further improving a resolution, a preferable polymer (base polymer) in a positive photosensitive composition is one containing both carboxyl and hydroxyphenyl groups in one molecule which meets all the following five requirements as much as possible;

(a) a higher solubility to a solution which solves a crosslinking agent, an acid-generating agent and others (solvent solubility);

(b) a certain dissolution rate of the cloven crosslink moieties in an alkali developing solution after exposure (dissolution rate in an alkali developing solution);

(c) good diffusivity of an acid generated by irradiation with an active energy beam (acid diffusivity);

(d) transparency of a photosensitive coating at an exposure wavelength (transparency); and (e) thermal stability during the heating step after application of the film and exposure (thermal stability).

As an example of a polymer meeting these requirements somewhat, a copolymer from p-hydroxystyrene, n-butyl acrylate and acrylic acid has been disclosed in, for example, JP-As 8-94827 and 8-94829. We have, however, investigated the copolymer for its performance and have concluded that it is insufficiently soluble in a solvent or thermally stable.

JP-A 61-293249 has disclosed a binary copolymer of 4-(1-methylethenyl)phenol and n-butyl acrylate as an example of a copolymer for a resin composition exhibiting damping property. The copolymer has an extremely lower dissolution rate in an alkali developing solution and is poorly compatible with a vinyl ether compound. It cannot be, therefore, used as it is.

SUMMARY OF THE INVENTION

An objective of this invention is to provide a positive sensitive resin composition useful as the above photoresist material as well as a process for forming a resist pattern using the composition.

We have prepared a variety of copolymers as a resin component in a positive sensitive resin composition, using 4-(1-methylethenyl)phenol and different monomers, to investigate them for their relationship between their basic physical properties and structures, and then have surprisingly found that a copolymer of 4-(1-methylethenyl)phenol, a (meth)acrylate and a (meth)acrylic acid as structural units in a particular composition ratio can meet all the above five requirements for a photoresist material ((a) solvent solubility, (b) dissolution rate in an alkali developing solution, (c) acid diffusivity, (d) transparency and (e) thermal stability).

This invention provides (I) A positive sensitive resin composition comprising a base polymer, an ether-bond-containing olefinic unsaturated compound and an acid-generating agent, where the base polymer is a copolymer comprising the structural units represented by formula (1):

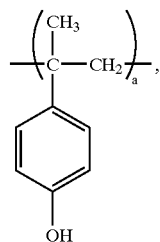  (1)

formula (2):

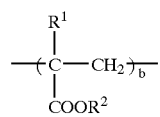  (2)

where $R^1$ is hydrogen or methyl and $R^2$ is $C_1$–$C_6$ straight or branched unsubstituted alkyl or $C_1$–$C_6$ straight or branched substituted alkyl, and formula (3):

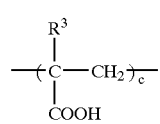  (3)

where $R^3$ is hydrogen or methyl, wherein a, b and c are 0.05 to 0.7, 0.15 to 0.8 and 0.01 to 0.5, respectively and a+b+c=1;

(II) A positive sensitive resin composition described in (I) where a compounding ratio of the copolymer comprising the structural units represented by formulas (1) to (3) and the ether-bond-containing olefinic unsaturated compound is 0.5 to 50/99.5 to 50 wt % as a ratio of copolymer/unsaturated compound based on their total wt % values, and the amount of the acid-generating agent is 0.1 to 40 wt parts to 100 wt parts of the total amount of the copolymer and the olefinic unsaturated compound;

(III) A positive sensitive resin composition described in (I) where $R^2$ in the structural unit represented by formula (2) is $C_1$–$C_6$ straight or branched unsubstituted alkyl or $C_1$–$C_6$ straight or branched hydroxylated alkyl;

(IV) A positive sensitive resin composition described in (I) where $R^2$ in the structural unit represented by formula (2) is selected from the group consisting of methyl, ethyl, n-propyl, isopropyl, n-butyl, isobutyl, sec-butyl and 2-hydroxyethyl;

(V) A positive sensitive resin composition described in (I) where a material giving the structural unit represented by formula (2) is a (meth)acrylate selected from the group consisting of methyl acrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butyl methacrylate, isobutyl methacrylate, sec-butyl methacrylate and 2-hydroxyethyl methacrylate;

(VI) A positive sensitive resin composition described in (I) where for the copolymer, a in formula (1) is 0.20 to 0.45, b in formula (2) is 0.25 to 0.70, and c in formula (3) is 0.15 to 0.40, and a+b+c=1;

(VII) A positive sensitive resin composition described in (I) or (V) where the copolymer comprising the structural units represented formulas (1), (2) and (3) is an alternating copolymer comprising the structural units represented by formula (4):

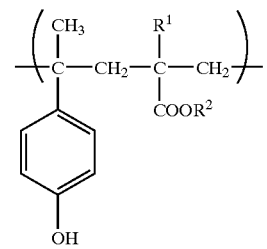  (4)

where $R^1$ is hydrogen or methyl and $R^2$ is $C_1$–$C_6$ straight or branched unsubstituted alkyl or $C_1$–$C_6$ straight or branched substituted alkyl, and formula (5):

$$\left(\begin{array}{c}CH_3 \\ -C-CH_2-C-CH_2 \\ | \\ COOH\end{array}\begin{array}{c}R^3 \\ \\ \end{array}\right) \quad\text{(5)}$$

where $R^3$ is hydrogen or methyl, in which the total content of these structural units is at least 60 mol %;

(VIII) A positive sensitive resin composition described in any of (I) to (VII) comprising a photosensitizer;

(IX) A positive sensitive resin composition described in (VIII) where a compounding ratio of the copolymer comprising the structural units represented by formulas (1) to (3) and the ether-bond-containing olefinic unsaturated compound is 0.5 to 50/99.5 to 50 wt % as a ratio of copolymer/unsaturated compound based on their total wt % values; the amount of the acid-generating agent is 0.1 to 40 wt parts to 100 wt parts of the total amount of the copolymer and the olefinic unsaturated compound; and the amount of the photosensitizer is 0.1 to 20 wt parts to 100 wt parts of the total amount of the copolymer, the olefinic unsaturated compound and the acid-generating agent;

(X) A positive ultraviolet sensitive resist comprising a composition described in any of (I) to (VII), whose part irradiated with ultraviolet rays is soluble or dispersible in an organic solvent or an aqueous developing solution, and whose unirradiated part is substantially insoluble and undispersible in an organic solvent or an aqueous developing solution;

(XI) A positive thermally sensitive resist comprising a composition described in any of (I) to (VII), whose part irradiated with heat rays is soluble or dispersible in an organic solvent or an aqueous developing solution, and whose unirradiated part is substantially insoluble and undispersible in an organic solvent or an aqueous developing solution;

(XII) A positive visible-light sensitive resist comprising a composition described in (VIII) to (IX), whose part irradiated with visible light is soluble or dispersible in an organic solvent or an aqueous developing solution, and whose unirradiated part is substantially insoluble and undispersible in an organic solvent or an aqueous developing solution;

(XIII) An organic-solvent type resin composition which is prepared by dissolving or dispersing the positive sensitive resin composition described in (I) to (IX) in an organic solvent.

(XIV) An aqueous resin composition which is prepared by dissolving or dispersing the positive sensitive resin composition described in (I) to (IX) in water.

(XV) An aqueous resin composition described in (XIV), wherein the dissolving or dispersing is carried out by neutralizing an anionic group in the positive sensitive resin composition with an alkali.

(XVI) A positive dry film comprises a substrate and a resist film, where the resist film is formed by applying a positive sensitive resin composition described in (I) to (IX) to a surface of the substrate.

(XVII) A process for forming a resist pattern consisting essentially of the steps of:

(1) applying a positive sensitive resin composition described in any of (I) to (IX) to a substrate surface to form a resist film;

(2) irradiating the resist film on the substrate with an active energy beam directly or via a mask film to form a desired pattern (image) on the film; and (3) developing the resist film to form a resist pattern on the substrate;

(XVIII) A process for forming a resist pattern consisting essentially of the steps of:

(1) applying a positive sensitive resin composition described in any of (I) to (IX) to a supporting substrate surface to form a positive dry film comprising a solid positive sensitive resin film;

(2) adhering the dry film on an adhered substrate surface in a manner that the adhered substrate surface faces the resin film of the dry film;

(3) irradiating the dry film surface with an active energy beam directly or via a mask film with or without peeling off the supporting substrate of the dry film, to form a desired pattern; and (4) developing the resist film, after peeling off the supporting substrate when it has not been removed in the step (3), to form a resist pattern on the substrate.

This invention involves a positive sensitive resin composition comprising a copolymer of 4-(1-methylethenyl) phenol, a (meth)acrylate and a (meth)acrylic acid, an ether-bond-containing olefinic unsaturated compound, and an acid-generating agent. A resist film formed from the composition may be, therefore, heated to be a crosslinked film considerably resistant to a developing solution, whose part irradiated with an active energy beam may be in turn cleaved crosslink to become soluble in a developing solution. The resist film may be, therefore, highly effective for forming a fine and sharp resist pattern.

DETAILED DESCRIPTION OF THE PREFERRED EMBODIMENTS

Figure 1:
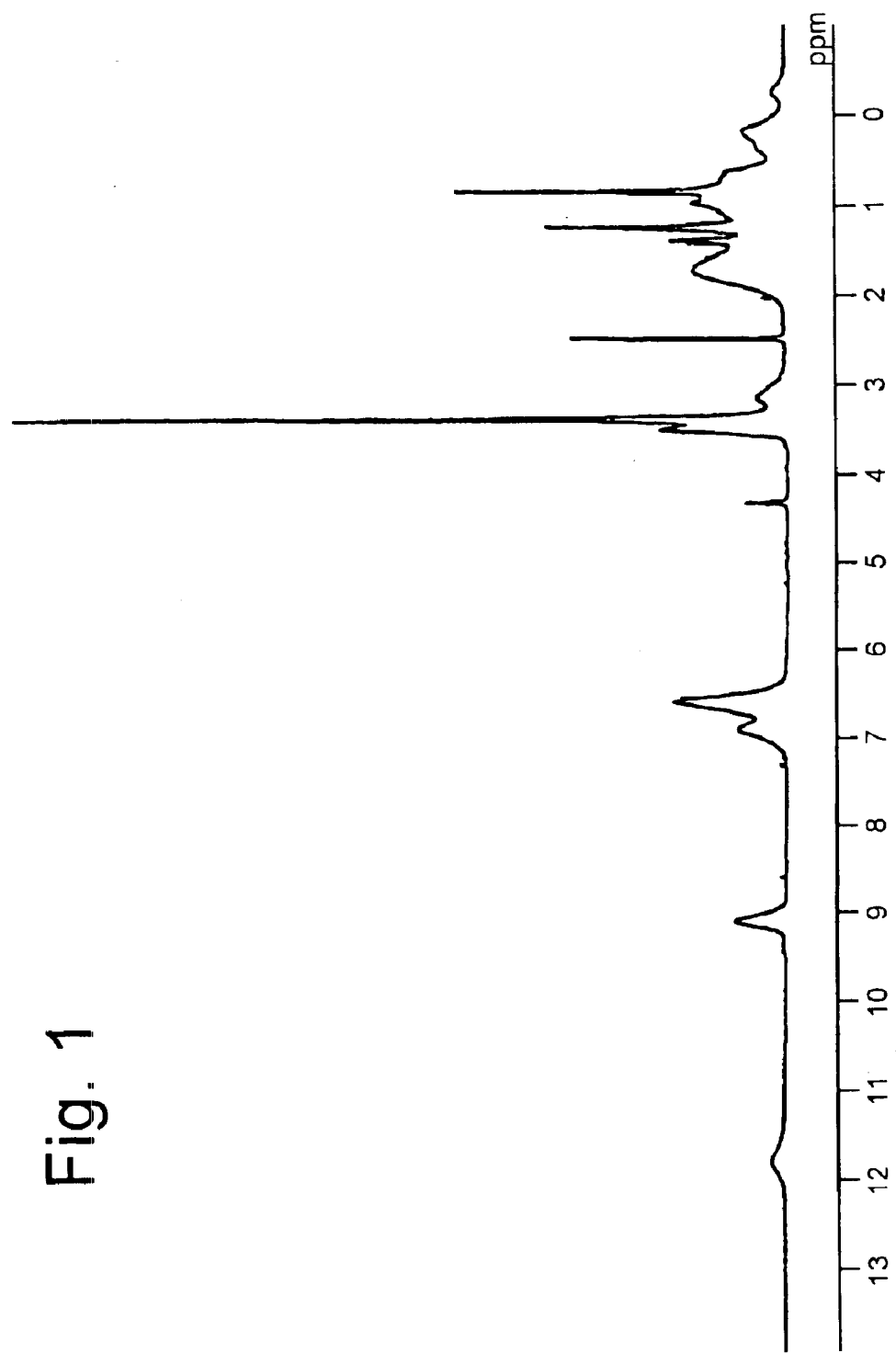
FIG. 1 shows an $^1$H-NMR spectrum of the copolymer of 4-(1-methylethenyl)phenol, methyl acrylate and acrylic acid prepared in Example 1, in $d_6$-dimethylsulfoxide.

A base resin used in a composition of this invention is a copolymer comprising the structural units represented by formulas (1), (2) and (3) (hereinafter, sometimes referred to simply as "the copolymer"). The rates, a, b and c, are 0.05 to 0.7, 0.15 to 0.8, and 0.01 to 0.5, respectively, and a+b+c=1.

In formula (2), $R^2$ is $C_1$–$C_6$ straight or branched unsubstituted alkyl or $C_1$–$C_6$ straight or branched substituted alkyl, including, for example, unsubstituted alkyls such as methyl, ethyl, n-propyl, isopropyl, n-butyl, isobutyl, sec-butyl, t-butyl, cyclohexyl and cyclopentyl; hydroxylated alkyls such as hydroxymethyl, 1-hydroxyethyl, 2-hydroxyethyl, 1-hydroxy-n-propyl, 2-hydroxy-n-propyl, 3-hydroxy-n-propyl, 1-hydroxyisopropyl, 2,3-dihydroxy-n-propyl, 1-hydroxy-n-butyl, 2-hydroxy-n-butyl, 3-hydroxy-n-butyl and 4-hydroxy-n-butyl; alkoxylated alkyls such as methoxymethyl, ethoxymethyl, 1-methoxyethyl, 2-methoxyethyl, 2-ethoxyethyl, 1-methoxy-n-propyl, 2-methoxy-n-propyl, 4-methoxy-n-butyl, 2-(2-ethoxyethoxy)ethyl, glycidyl, tetrahydrofurfuryl and 2-tetrahydrofuryl; halogenated alkyls such as 2,2,2-trifluoroethyl, hexafluoroisopropyl, 2,2,3,4,4,4-hexafluorobutyl, 2-chloroethyl, trichloroethyl, 2-bromoethyl and heptafluoro-2-propyl; cyanated alkyls such as 2-cyanoethyl; dialkylaminated alkyls such as 2-(dimethylamino)ethyl, 3-(dimethylamino)propyl and 3-dimethylamino-neopentyl.

Preferably, $R^2$ is $C_1$–$C_6$ straight or branched unsubstituted or hydroxylated alkyl; more preferably, methyl, ethyl, n-propyl, isopropyl, n-butyl, isobutyl, sec-butyl or 2-hydroxyethyl. The copolymer used in the composition of the present invention may comprise two or more types of the structural unit represented by formula (2). Specifically, a copolymer comprising four or more structural units; for example, a copolymer comprising structural units of one type of formula (1), two or more types of formula (2) and one type of formula (3), may be used for the composition of this invention.

In formula (3), $R^3$ is hydrogen or methyl. Again, either or both of these structural units represented by formula (3) may be contained in a copolymer In the copolymer used in the composition of this invention, the composition ratios of the structural units represented by formulas (1), (2) and (3) are considerably important. Assuming that there is a relationship a+b+c=1 between the composition ratios of a, b and c, a, b and c are, in an embodiment, 0.05 to 0.7, 0.15 to 0.8 and 0.01 to 0.5, respectively; in a preferable embodiment, 0.1 to 0.5, 0.20 to 0.75 and 0.1 to 0.4, respectively; in a more preferable embodiment, 0.20 to 0.45, 0.25 to 0.70 and 0.15 to 0.40, respectively. When two or more types of the structural units represented by formulas (2) and/or (3) are present, the composition ratio of b or c is its total composition ratio. Composition ratios a, b and c are determined by $^1$H-NMR and $^{13}$C-NMR.

The copolymer used in the composition of this invention may be a copolymer in which the structural units represented by formulas (1), (2) and (3) are randomly copolymerized; these three structural units are alternately copolymerized; or these units are block-copolymerized. A preferable copolymer is one largely comprising a moiety in which the structural unit represented by formula (1) and the structural units represented by formulas (2) and (3) are alternately copolymerized. Specifically, the most preferable copolymer is an alternating copolymer comprising structural units represented by formula (4):

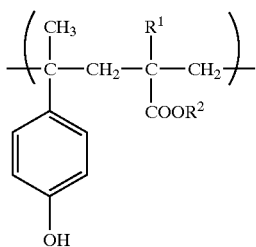

(4)

where $R^1$ is hydrogen or methyl and $R^2$ is $C_1$–$C_6$ straight or branched unsubstituted alkyl or $C_1$–$C_6$ straight or branched substituted alkyl, and formula (5):

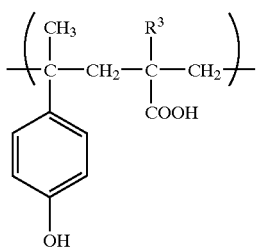

(5)

where $R^3$ is hydrogen or methyl, wherein the total content of these structural units is at least 50 mol %, preferably at least 60 mol %.

A weight-average molecular weight (Mw) of the copolymer used in the composition of this invention may vary, depending on its application. For example, when used as a base polymer in a photosensitive composition, it is generally 3,000 to 100,000, preferably 4,000 to 70,000, more preferably 5,000 to 50,000.

Molecular-weight dispersion (Mw/Mn) is generally 1.0 to 3.5, preferably 1.0 to 3.0, and more preferably 1.0 to 2.5. A weight-average molecular weight and molecular-weight dispersion are determined by gel permeation chromatography (GPC) which is converted into polystyrene.

A glass transition point for the copolymer used in the composition of this invention may depend on its composition or composition ratio, but generally 0 to 200° C., preferably 10 to 150° C., more preferably 30 to 120° C. A glass transition point is determined with a differential scanning calorimeter (DSC).

The copolymer used in the composition of this invention exhibits excellent transparency. Its transmittance at 350 nm is generally at least 70%/μm, preferably at least 90%/μm, more preferably at least 95%/μm. A transmittance is determined at 30 nm for a 1 μm thick film formed on a quartz substrate by spin coating, with a spectrophotometer for ultraviolet and visible region.

Furthermore, the copolymer used in the composition of this invention exhibits excellent solubility in an aqueous alkali solution. A dissolution rate in a 2.38 wt % aqueous solution of tetramethylammonium hydroxide is generally 1 μm/min, and preferably 5 μm/min. A dissolution rate is determined by applying the copolymer on a copper-coated substrate with a bar coater, heating it at 80° C. for 30 minutes to form a film 5 μm of thickness, soaking it in a 2.38 wt % aqueous solution of tetramethylammonium hydroxide and then measuring the film thickness with a dial thickness gage.

The copolymer used in the composition of this invention may be prepared by heating a mixture of (a) 4-(1-methylethenyl)phenol, (b) a (meth)acrylate represented by formula (6):

(6)

where $R^1$ is hydrogen or methyl and $R^2$ is $C_1$–$C_6$ straight or branched unsubstituted alkyl or $C_1$–$C_6$ straight or branched substituted alkyl, (c) a (meth)acrylic acid represented by formula (7):

(7)

where $R^3$ is hydrogen or methyl, (d) a radical-polymerization initiator and (e) a solvent in a particular molar ratio.

One material, 4-(1-methylethenyl)phenol, may be readily prepared by thermal decomposition of bisphenol A (e.g., JP-B 56-52886).

Examples of the (meth)acrylate represented by formula (6) as another material are $C_1$–$C_6$ straight or branched unsubstituted acrylates or methacrylates and $C_1$–$C_6$ straight or branched substituted acrylates or methacrylates, including unsubstituted alkyl acrylates such as methyl acrylate, ethyl acrylate, n-propyl acrylate, isopropyl acrylate, n-butyl acrylate, isobutyl acrylate, sec-butyl acrylate, t-butyl acrylate, cyclohexyl acrylate and cyclopentyl acrylate; hydroxylated-alkyl acrylates such as hydroxymethyl acrylate, 1-hydroxyethyl acrylate, 2-hydroxyethyl acrylate, 1-hydroxy-n-propyl acrylate, 2-hydroxy-n-propyl acrylate, 3-hydroxy-n-propyl acrylate, 1-hydroxyisopropyl acrylate, 2,3-dihydroxypropyl acrylate, 1-hydroxy-n-butyl acrylate, 2-hydroxy-n-butyl acrylate, 3-hydroxy-n-butyl acrylate and 4-hydroxy-n-butyl acrylate; alkoxylated-alkyl acrylates such as methoxymethyl acrylate, ethoxymethyl acrylate, 1-methoxyethyl acrylate, 2-methoxyethyl acrylate, 2-ethoxyethyl acrylate, 1-methoxy-n-propyl acrylate, 2-methoxy-n-propyl acrylate, 4-methoxy-n-butyl acrylate, 2-(2-ethoxyethoxy)ethyl acrylate, glycidyl acrylate, tetrahydrofurfuryl acrylate and 2-tetrahydrofuryl acrylate; halogenated-alkyl acrylates such as 2,2,2-trifluoroethyl acrylate, hexafluoroisopropyl acrylate, 2,2,3,4,4,4-hexafluorobutyl acrylate, 2-chloroethyl acrylate, trichloroethyl acrylate, 2-bromoethyl acrylate and heptafluoro-2-propyl acrylate; cyanated-alkyl acrylates such as 2-cyanoethyl acrylate; dialkylaminated-alkyl acrylates such as 2-(dimethylamino)ethyl acrylate, 3-(dimethylamino)propyl acrylate and 3-dimethylamino-neopentyl acrylate; unsubstituted alkyl methacrylates such as methyl methacrylate, ethyl methacrylate, n-propyl methacrylate, isopropyl methacrylate, n-butyl methacrylate, isobutyl methacrylate, sec-butyl methacrylate, t-butyl methacrylate, cyclohexyl methacrylate and cyclopentyl methacrylate; hydroxylated-alkyl methacrylates such as hydroxymethyl methacrylate, 1-hydroxyethyl methacrylate, 2-hydroxyethyl methacrylate, 1-hydroxy-n-propyl methacrylate, 2-hydroxy-n-propyl methacrylate, 3-hydroxy-n-propyl methacrylate, 1-hydroxyisopropyl methacrylate, 2,3-dihydroxypropyl methacrylate, 1-hydroxy-n-butyl methacrylate, 2-hydroxy-n-butyl methacrylate, 3-hydroxy-n-butyl methacrylate and 4-hydroxy-n-butyl methacrylate; alkoxylated-alkyl methacrylates such as methoxymethyl methacrylate, ethoxymethyl methacrylate, 1-methoxyethyl methacrylate, 2-methoxyethyl methacrylate, 2-ethoxyethyl methacrylate, 1-methoxy-n-propyl methacrylate, 2-methoxy-n-propyl methacrylate, 4-methoxy-n-butyl methacrylate, 2-(2-ethoxyethoxy)ethyl methacrylate, glycidyl methacrylate, tetrahydrofurfuryl methacrylate and 2-tetrahydrofuryl methacrylate; halogenated-alkyl methacrylates such as 2,2,2-trifluoroethyl methacrylate, hexafluoroisopropyl methacrylate, 2,2,3,4,4,4-hexafluorobutyl methacrylate, 2-chloroethyl methacrylate, trichloroethyl methacrylate, 2-bromoethyl methacrylate and heptafluoro-2-propyl methacrylate; cyanated-alkyl methacrylates such as 2-cyanoethyl methacrylate; dialkylaminated-alkyl methacrylates such as 2-(dimethylamino)ethyl methacrylate, 3-(dimethylamino) propyl methacrylate and 3-dimethylamino-neopentyl methacrylate.

Among others, preferable (meth)acrylates are unsubstituted alkyl acrylates, hydroxylated-alkyl acrylates, unsubstituted alkyl methacrylates and hydroxylated-alkyl methacrylates; more preferable (meth)acrylates are methyl acrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butyl methacrylate, isobutyl methacrylate, sec-butyl methacrylate and 2-hydroxyethyl methacrylate. These acrylates may be used alone, concurrently or as a mixture of two or more. In the latter case, there may be formed a copolymer where two or more types of the structural unit represented by formula (2) are randomly copolymerized, in which a composition ratio b is the total of the composition ratios for two or more types of the structural unit represented by formula (2).

A (meth)acrylic acid represented by formula (7) as another material is acrylic or methacrylic acid, which may be used alone, concurrently or as a mixture of two.

These 4-(1-methylethenyl)phenol, a (meth)acrylate or a (meth)acrylic acid may contain additives; for example, a stabilizer such as an alkali compound including potassium hydroxide or a polymerization inhibitor. These materials are preferably subject to a common purification process such as recrystallization and distillation for removing a stabilizer before their use, while commercially available materials may be used as they are without any purification process.

The amounts of 4-(1-methylethenyl)phenol, a (meth)acrylate and a (meth)acrylic acid are preferably selected to be their composition ratios in a desired copolymer. Specifically, the mole fractions of 4-(1-methylethenyl) phenol, a (meth)acrylate and a (meth)acrylic acid are 0.05 to 0.7, 0.15 to 0.8, and 0.01 to 0.5, respectively and the total of these mole fractions is 1; preferably 0.1 to 0.5, 0.20 to 0.75, and 0.1 to 0.4, respectively; more preferably 0.20 to 0.45, 0.25 to 0.70, and 0.15 to 0.40, respectively.

A radical-polymerization initiator in the preparation process of the copolymer may be any of initiators used in a common radical polymerization; for example, azo initiators such as azobisisobutyronitrile, azobis-2,4-dimethylvaleronitrile, azobiscyclohexanecarbonitrile, azobis-2-amidinopropane hydrochloride, dimethyl azobisisobutyrate, azobisisobutylamidine hydrochloride and 4,4'-azobis-4-cyanovaleric acid; peroxide initiators such as benzoyl peroxide, 2,4-dichlorobenzoyl peroxide, di-tert-butyl peroxide, lauroyl peroxide, acetyl peroxide, peroxydiisopropyl dicarbonate, cumene hydroperoxide, tert-butyl hydroperoxide, dicumyl peroxide, p-menthane hydroperoxide, pinane hydroperoxide, methyl ethyl ketone peroxide, cyclohexanone peroxide, diisopropyl peroxydicarbonate, tert-butyl peroxylaurate, di-tert-butyl peroxyphthalate, dibenzyl oxide and 2,5-dimethylhexane-2, 5-dihydroperoxide; and redox initiators such as benzoyl peroxide-N,N-dimethylaniline and peroxodisulfuric acid-sodium hydrogen sulfite.

Among others, preferable initiators are azo initiators and peroxide initiators. More preferable initiators are azobisisobutyronitrile, azobis-2,4-dimethylvaleronitrile, azobiscyclohexanecarbonitrile, dimethyl azobisisobutyrate, benzoyl peroxide, 2,4-dichlorobenzoyl peroxide, di-tert-butyl peroxide, lauroyl peroxide, peroxydiisopropyl dicarbonate and acetyl peroxide. These radical-polymerization initiators may be used alone or two or more of them may be used concurrently or sequentially.

These initiators may be used in a mole fraction of 0.0001 to 0.1, preferably 0.001 to 0.1, more preferably 0.005 to 0.05, to the total amount of (a) 4-(1-methylethenyl)phenol, (b) a (meth)acrylate represented by formula (6) and (c) a (meth)acrylic acid represented by formula (7). In this invention, all of these radical-polymerization initiators may be charged at the beginning of heating, or all or a part of these may be added after initiation of heating as long as the total amount of the initiators is within the limits.

Any solvent may be used as long as it does not adversely affect the desired reaction; for example, ketones such as acetone, methyl ethyl ketone, methyl isobutyl ketone, cyclohexanone, cyclopentanone and γ-butyrolactone; alcohols such as n-propyl alcohol, isopropyl alcohol, n-butyl alcohol, tert-butyl alcohol, n-octanol, 2-ethylhexanol and n-dodecyl alcohol; glycols such as ethylene glycol, propylene glycol and diethylene glycol; ethers such as ethylene glycol dimethyl ether, ethylene glycol diethyl ether, diethylene glycol dimethyl ether, diethylene glycol diethyl ether, diethylene glycol methyl ethyl ether, tetrahydrofuran and dioxane; alcohol ethers such as ethylene glycol monomethyl ether, ethylene glycol monoethyl ether, propylene glycol monomethyl ether, propylene glycol monoethyl ether and diethylene glycol monomethyl ether; esters such as n-propyl formate, isopropyl formate, n-butyl formate, methyl acetate, ethyl acetate, n-propyl acetate, isopropyl acetate, n-butyl acetate, isobutyl acetate, n-amyl acetate, n-hexyl acetate, methyl propionate, ethyl propionate and methyl butyrate; monooxycarboxylates such as methyl 2-oxypropionate, ethyl 2-oxypropionate, n-propyl 2-oxypropionate, isopropyl 2-oxypropionate, ethyl 2-oxy-2-methylpropionate and methyl 2-oxy-3-methylbutyrate; alkoxycarboxylates such as ethyl methoxyacetate, ethyl ethoxyacetate, methyl 3-methoxypropionate, ethyl 3-methoxypropionate and methyl 3-ethoxypropionate; cellosolve esters such as cellosolve acetate, methyl cellosolve acetate, ethyl cellosolve acetate and butyl cellosolve acetate; aromatic hydrocarbons such as benzene, toluene and xylenes; halogenated hydrocarbons such as trichloroethylene, chlorobenzene and dichlorobenzene; and amides such as dimethylacetamide, dimethylformamide, N-methylacetamide, N-methylpyrrolidone and N,N'-dimethylimidazolidinone.

These solvents may be used alone or as a mixture of two or more. It is preferable that these solvents are used to give a homogeneous reaction solution, but the reaction mixture may consist of heterogeneous two or more phases. The amount of the solvent may vary depending on a variety of factors such as materials to be used, the type and the amount of a radical-polymerization initiator, and the molecular weight of a desired copolymer, but generally 5 to 10,000 wt parts, preferably 20 to 5,000 wt parts, more preferably 50 to 1,000 wt parts, to 100 wt parts of the total amount of the materials.

The polymerization reaction may be conducted in any style of batch, semi-batch or continuous flow, as long as (a) 4-(1-methylethenyl)phenol, (b) a (meth)acrylate represented by formula (6), (c) a (meth)acrylic acid represented by formula (7), (d) a radical-polymerization initiator, (e) a solvent and others are effectively mixed and contacted with each other. Generally, all of these materials may be charged in a reactor before heating, or alternatively materials, a radical-polymerization catalyst and a solvent may be continuously or intermittently added into a reactor in which at least a part of the solvent has been charged.

Among these styles, the reaction is preferably conducted, maintaining the total concentration of 4-(1-methylethenyl)phenol, a (meth)acrylate and a (meth)acrylic acid at 20 wt % or less in the reaction system throughout the heating step. In particular, as 4-(1-methylethenyl)phenol, a (meth)acrylate and a (meth)acrylic acid are consumed by polymerization, these materials are continuously or intermittently supplied into the reaction system in an appropriate amount. More specifically, the materials and a radical-polymerization initiator may be continuously or intermittently added into a reactor in which a solvent has been charged; the materials may be continuously or intermittently added into a reactor in which a solvent and a radical-polymerization initiator have been charged; into a reactor in which parts of a solvent and a radical-polymerization initiator have been charged, the materials and the remaining solvent and radical-polymerization initiator may be continuously or intermittently added; or alternatively, into a reactor in which parts of the materials, a solvent and a radical-polymerization initiator have been charged, the remaining materials, solvent and radical-polymerization initiator may be continuously or intermittently added.

In this preparation process, a polymerization reaction proceeds by heating. Heating may be conducted at any temperature which may allow the reaction to proceed. The temperature may vary depending on various factors such as a polymerization degree, a composition and a composition ratio in a desired polymer and the types and the amounts of a radical-polymerization initiator and a solvent, but generally 50 to 250° C., preferably 50 to 180° C., more preferably 60 to 160° C.

A polymerization duration may also vary depending on various factors such as a polymerization degree, a composition and a composition ratio in a desired polymer and the types and the amounts of a radical-polymerization initiator and a solvent, but generally up to 40 hours, preferably 0.01 to 20 hours. The reaction may be conducted under a reduced, ambient or elevated pressure.

The polymerization reaction is preferably conducted in an atmosphere of an inert gas such as nitrogen and argon, but may be conducted in the presence of molecular oxygen, e.g., in the air.

In the preparation process, additives such as a phenol compound may be used for, e.g., improving a yield of the copolymer and altering the sequence of the structural units in the copolymer.

After the completion of the polymerization reaction, a product copolymer may be isolated from the reaction mixture by a common technique such as solvent extraction, fractional precipitation and film evaporation. The mixture may be sometimes used as it is in a subsequent application without isolating a desired product copolymer.

In the composition of this invention, an ether-bond-containing-olefinic unsaturated compound may be a low or high molecular weight compound comprising about 1 to 4, preferably 2 to 4 unsaturated ether groups such as vinyl ether represented by formula —R'—O—CH=CH$_2$ where R' is $C_1$–$C_6$ straight or branched alkylene such as methylene, ethylene, propylene and butylene, 1-propenyl ether and 1-butenyl ether, in one molecule.

Examples of such an ether-bond-containing-olefinic unsaturated compound are condensation products of a polyphenol such as bisphenol A, bisphenol F, bisphenol S and a phenol resin or a polyol such as ethylene glycol, propylene glycol, trimethylolpropane, trimethylolethane and pentaerythritol, with a halogenated-alkyl vinyl ether such as chloroethyl vinyl ether. In particular, a condensation product of the above polyphenol with a halogenated-alkyl vinyl ether is preferable in the light of its etching resistance and precision of a pattern to be formed.

The ether-bond-containing olefinic unsaturated compound may be an ether-bond-containing olefinic polyurethane comprising about 1 to 4, preferably 2 to 4 unsaturated ether groups described above and at least one urethane bond in one molecule.

Examples of such a polyurethane unsaturated compound are a reaction product of a polyisocyanate described below, a hydroxyalkyl vinyl ether and, as necessary, the above compound having at least two hydroxy groups in one molecule; and a condensation product of a polyphenol such as bisphenol A, bisphenol F, bisphenol S and a phenol resin or a polyol such as ethylene glycol, propylene glycol, trimethylolpropane, trimethylolethane and pentaerythritol, a polyisocyanate described below, and a halogenated-alkyl vinyl ether such as chloroethyl vinyl ether. In particular, a reaction product of a polyisocyanate and a hydroxyalkyl vinyl ether is preferable in the light of its etching resistance and precision of a pattern to be formed.

Examples of the above polyisocyanate include aliphatic diisocyanates such as hexamethylene diisocyanate, trimethylene diisocyanate, 1,4-tetramethylene diisocyanate, pentamethylene diisocyanate, 1,2-propylene diisocyanate, 1,2-butylene diisocyanate, trimethylhexamethylene diisocyanate, dimer acid diisocyanate, lysine diisocyanate, 2,3-butylene diisocyanate and 1,3-butylene diisocyanate; alicyclic diisocyanates such as isophorone diisocyanate, 4,4'-methylene bis(cyclohexylisocyanate), methylcyclohexane-2,4-(or -2,6-)diisocyanate, 1,3-(or 1,4-)di(isocyanatomethyl)cyclohexane, 1,4-cyclohexane diisocyanate, 1,3-cyclopentane diisocyanate and 1,2-cyclohexane diisocyanate; aromatic diisocyanates such as p-xylylene diisocyanate, meta-xylylene diisocyanate, tetramethylxylylene diisocyanate, tolylene diisocyanate, 4,4'-diphenylmethane diisocyanate, 1,5-naphthalene diisocyanate, 1,4-naphthalene diisocyanate, 4,4'-toluidine diisocyanate, 4,4'-diphenyl ether diisocyanate, (m- or p-)phenylene diisocyanate, 4,4'-biphenylene diisocyanate, 3,3'-dimethyl-4,4'-biphenylene diisocyanate, bis(4-isocyanatophenyl)sulfone and isopropylidene bis(4-phenylisocyanate). Other polyisocyanates may be used; for example, polyisocyanates comprising at least three isocyanate groups such as triphenylmethane-4,4',4"-triisocyanate, 1,3,5-triisocyanatobenzene, 2,4,6-triisocyanatotoluene, 4,4'-dimethyldiphenylmethane-2,2',5,5'-tetraisocyanate; an adduct obtained by reacting a polyol such as ethylene glycol, propylene glycol, 1,4-butylene glycol, polyalkylene glycol, trimethylolpropane and hexane triol with a polyisocyanate in an amount giving excessive isocyanate groups to the hydroxy groups in the polyol; biuret type adducts such as hexamethylene diisocyanate, isophorone diisocyanate, tolylene diisocyanate, xylylene diisocyanate, 4,4'-diphenylmethane diisocyanate and 4,4'-methylene bis(cyclohexylisocyanate); and isocyanurate-ring type adducts.

Among others, preferable polyisocyanates are isophorone diisocyanate, xylylene diisocyanate, tolylene diisocyanate, 1,6-hexamethylene diisocyanate, 2,2,4-trimethylhexamethylene diisocyanate and 2,4,4-trimethylhexamethylene diisocyanate.

Preferably, the ether-bond-containing olefinic unsaturated compound is liquid at an ambient temperature or has a melting or softening point of below 150° C., particularly below 130° C. because an addition reaction between the carboxyl groups in the copolymer and the ether groups in the unsaturated compound may be accelerated during heating before irradiating with an active energy beam.

A compounding ratio of the copolymer and the ether-bond-containing olefinic unsaturated compound is 0.5 to 50/99.5 to 50 wt %, preferably 1 to 30/99 to 70 wt %, more preferably 1 to 15/99 to 85 wt % as a ratio of copolymer/ether-bond-containing olefinic unsaturated compound based on their total wt % values. If the copolymer is contained at less than 0.5 wt %, i.e., the ether-bond-containing olefinic unsaturated compound is contained at more than 99.5 wt %, resistance to a developing solution of an unirradiated part tends to be reduced. On the other hand, if the copolymer is contained at more than 50 wt %, i.e., the ether-bond-containing olefinic unsaturated compound is contained at less than 50 wt %, sensitivity and storage stability may tend to be reduced.

The acid-generating agent used in the composition of this invention is a compound or mixture generating an acid when irradiated with an active energy beam, which, in turn, acts as a catalyst for decomposing a resist film crosslinked by the reaction of the copolymer with the olefinic unsaturated compound. Any known acid-generating agent may be any used.

Examples of a compound or mixture used as an acid-generating agent are onium salts such as ammonium, phosphonium, sulfonium, selenium and iodonium salts; diazonium salts; halogenated compounds; a combination of an organometallic/organohalogen compounds; benzoin or o-nitrobenzyl ester of a strong acid such as toluenesulfonic acid; and N-hydroxyamides and N-hydroxyimidosulfonates described in U.S. Pat. No. 4,371,605. Arylnaphthoquinone diazide-4-sulfonates may be used.

Another effective group of acid-generating agents includes oligomers or polymers to which is added an anion group comprising an aromatic onium-acid-generating agent as a positive counter ion. Such polymers have been described in, for example, Column 9, lines 1 to 68 and Column 10, lines 1 to 14 in U.S. Pat. No. 4,661,429, which is herein incorporated by reference.

Another suitable acid-generating agent is ATASS, i.e, 3-(9-anthracenyl)propyldiphenylsulfonium hexafluoroantimonate, in which anthracene and sulfonium salt is linked via a chain consisting of three carbons. Other acid-generating agents which may be used include diphenyliodonium tosylate, benzoin tosylate and triarylphosphonium hexafluoroantimonate.

Besides the above acid-generating agents, for example, iron-arene complexes, ruthenium-arene complexes, silanol-metal chelate complexes, triazines, diazidonaphthoquinones, sulfonates and sulfonimide esters. Photo acid-generating agents described in JP-As 7-146552, 11-237731 (naphthalimidylsulfonate) and 10-204407 (ruthenocene compounds) may be also used.

Photo acid-generating agents suitable to exposure by light irradiation are diaryliodonium and triarylsulfonium salts. These are generally present in a form of complex metal-halide such as tetrafluoroborate, hexafluoroantimonate, hexafluoroarsenate and hexafluorophosphate.

When the composition is used in irradiating with heat rays such as infrared ray, a thermal acid-generating agent such as those described in JP-AS 1-96169, 2-1470, 2-255646, 2-268173, 3-11044, 3-115262, 4-1177, 4-327574, 4-308563, 4-328106, 5-132461, 5-132462, 5-140132, 5-140209, 5-140210, 5-170737, 5-230190, 5-230189, 6-271532, 6-271544, 6-321897, 6-321915, 6-345726, 6-345733, 7-25852, 7-25863 and 7-89909, JP-A1-95/501581, and International Patent Publication WO 97/08141 may be used in addition to the above acid-generating agent.

A compounding ratio of the acid-generating agent is preferably about 0.1 to 40 wt parts, particularly about 0.2 to 20 wt parts to 100 wt parts of the total amount of the copolymer and the olefinic unsaturated compound.

When the composition of this invention is used in irradiation with visible light (400 nm to 520 nm), it is preferable to add a photosensitizer. A photosensitizer is a compound which may be excited by absorbing visible light to interact with a copolymer or an acid-generating agent. The interaction may include energy or electron transfer from the excited photosensitizer to the copolymer or acid-generating agent. Any known photosensitizer may be used as long as it has the above properties.

A variety of known photosensitive dyes may be used as a photosensitizer; for example, thioxanthene, xanthene, ketone, thiopyrylium salt, base styryl, merocyanine, 3-substituted coumarin, 3,4-substituted coumarin, cyanine, acridine, thiazine, phenothiazine, anthracene, coronene, benzanthracene, perylene, merocyanine, ketocoumarin, fumarin and borate dyes. These may be used alone or in combination of two or more. Borate photosensitive dyes which may be used include those described in JP-As 5-241338, 7-5685, 7-225474, 8-6245, 7-219223, 11-116612, 11-100408 and 10-273504.

A compounding ratio of the photosensitizer is up to 20 wt parts, preferably about 0.1 to 10 wt parts, particularly about 0.1 to 5 wt parts to 100 wt parts of the total amount of the copolymer, the olefinic unsaturated compound and the acid-generating agent.

When a film formed from the composition of this invention is heated, a carboxyl group and an unsaturated ether group in the copolymer form a crosslink via addition reaction, to make the film insoluble to a solvent or aqueous alkali solution. Subsequently, by irradiating it with an active energy beam and then heating it, an acid is generated, which acts as a catalyst to cleave the crosslink structure. Thus, the exposed part again becomes soluble to a solvent or aqueous alkali solution.

Thus, in the composition, the acid generated by irradiating the formed film with an active energy beam allows acid hydrolysis to proceed in the exposed part. To facilitate the acid hydrolysis, it is preferable that moisture is present. The composition of this invention may, therefore, contain a hydrophilic resin such as polyethylene glycol, polypropylene glycol, methyl cellulose and ethyl cellulose for facilitating uptake of moisture adequate for the above reaction by an applied film. The amount of such a hydrophilic resin is generally up to 20 wt parts, preferably 0.1 to 10 wt parts to 100 wt parts of the resin composition.

The composition of this invention may, as necessary, contain another resin insoluble or soluble (or dispersible) in water or an organic solvent for improving or reducing its solubility in an organic solvent or aqueous developing solution; for example, a phenol resin, a polyester resin, a (meth)acrylic resin, a vinyl resin, a vinyl acetate resin, an epoxy resin, a silicone resin, a fluororesin, combination of two or more, and their modified products.

The composition of this invention may contain a plasticizer (e.g., a phthalate), a polyester resin and/or a (meth) acrylic resin for endowing a film formed from the composition of this invention with appropriate flexibility and/or non-adherence.

The composition of this invention may, as necessary, contain a fluidity modifier, a plasticizer and/or a coloring agent such as a dye and a pigment.

The composition of this invention may be used as an organic-solvent type resin composition such as an organic-solvent type UV sensitive resin composition, an organic-solvent type visible-light sensitive resin composition and an organic-solvent type thermally sensitive resin composition or an aqueous resin composition such as an aqueous UV sensitive resin composition, an aqueous visible-light sensitive resin composition and an aqueous thermally sensitive resin composition.

The above organic-solvent type resin composition may be prepared by dissolving or dispersing the positive sensitive resin composition in an organic solvent such as ketones, esters, ethers, cellosolves, aromatic hydrocarbons, alcohols and halogenated hydrocarbons. The composition may be applied to a substrate (e.g., a sheet of metal such as aluminum, magnesium, copper, zinc, chromium, nickel, iron and an alloy mainly consisting of them as well as a printed board, plastic, glass, silicon wafer and carbon whose surface has been treated with any of the above metals), by an appropriate means such as roller, roll coater, spin coater, curtain-roll coater, spraying, electrostatic coating, dip coating and silk printing, and then, optionally after setting, dried to give a resist material (film).

The aqueous resin composition may be prepared by dissolving or dispersing the positive sensitive resin composition in water. The aqueous composition may be handled in a similar manner to a common photosensitive material for electrodeposition and may be used as an electrodeposition paint. The positive sensitive resin composition may be dissolved or dispersed in water by neutralizing an anionic group such as a carboxyl group in the positive sensitive resin composition with an alkali (neutralizing agent).

Examples of such an alkali neutralizing agent may be monoethanolamine, diethanolamine, triethylamine, diethylamine, dimethylaminoethanol, cyclohexylamine and ammonia. The amount of the neutralizing agent is generally 0.2 to 1.0 equivalent, preferably 0.3 to 0.8 equivalent to 1 equivalent of an ionic group in the positive sensitive resin composition.

The ionic-group-containing resin may preferably contain a carboxyl group in such a proportion that the acid value of the resin is about 30 to 700 mgKOH/g, and particularly about 40 to 600 mgKOH/g. If the acid value is less than about 30, an uncured film may be removed, by treating with a developing solution, too insufficiently to adequately remove copper in a subsequent etching step. On the other hand, if the acid value is more than about 700, the resist film region (cured film region) may be removed too easily to form a satisfactory copper circuit.

An electrodeposition paint may be an anion electrodeposition paint at pH 7 to 9, in which a bath concentration (solid concentration) is adjusted to 3 to 25 wt %, and particularly 5 to 15 wt %.

An electrodeposition paint may be, for example, applied to a conductor surface as a matter to be coated as follows. First, bath pH and concentration are adjusted to the above ranges and the bath temperature is controlled to be 15° C. to 40° C., preferably 15° C. to 30° C. Then, a substrate (conductor) to be painted is immersed as an anode in the electrodeposition bath controlled as described above, and a direct current of 5 to 200 volts is applied. An appropriate electrification time is 10 seconds to 5 minutes. A film thickness to be formed is generally 0.5 to 50 $\mu$m, particularly 1 to 15 $\mu$m as a dry thickness.

After electrodeposition, the coated matter is pulled up from the electrodeposition bath and washed with water. Then, moisture and others are removed by, e.g., hot air drying. The conductor may be a conductive material such as a metal, carbon and stannic oxide, or a plastic or glass on whose surface is fixed any of the above materials by, for example, laminating or plating.

Besides the above applications, the composition of this invention may be applied to a transparent resin film to be a base film layer, such as a polyester resin (e.g., polyethylene terephthalate), a (meth)acrylic resin, polyethylene and polyvinyl chloride resin, using an appropriate means such as a roll coater, a blade coater and a curtain flow coater, and then dried to form a resist film having about 2 to 15 $\mu$m of dry thickness, on whose surface is then applied a protective film to provide a dry film resist.

After peeling the protective film off, the dry film resist may be applied to a substrate as described above by an appropriate technique such as thermocompression bonding in a manner that the resist film faces the substrate, to form a resist film. With or without peeling the base film layer off, the resist film thus obtained may be exposed by irradiating with an active energy beam according to an image as described for the electrodeposition film, and developing the resist film (over the base film when it has not been removed), to form an image.

The composition of this invention may be used in a variety of applications utilizing a well-known exposure-based lithography technique, such as a resist material for an electron device, a machine plate material (e.g., a flat plate or a plate material for relief printing and a PS plate for offset printing), an information recording material and a material for fabricating a relief.

Specifically, it may be used for printing and forming a pattern such as an insulating pattern formed on a substrate surface including a black matrix insulating pattern, an insulating pattern for a color filter, a pattern for covering an electron device (a film for soldering), a ceramic or fluorescent-substance insulating pattern and a barrier pattern for a display panel, as well as a pattern on an insulating substrate including a plastic circuit board and a plastic build-up board. For example, it may be used for forming a conductive pattern for a black matrix, a conductive pattern for a color filter, a conductive pattern for different display panels and a conductive pattern formed on a plastic board or a plastic build-up board.

An typical example of pattern forming for a liquid resist or dry film resist using the composition of this invention will be described.

A Pattern Forming Process Using a Liquid Resist:

A pattern may be formed by a process consisting essentially of the steps of:

(1) applying the above liquid positive sensitive resin composition to a substrate surface to form a resist film;

(2) irradiating the resist film on the substrate with an active energy beam such as ultraviolet laser, visible light (e.g., monochromatic light within a visible region of 400 to 600 nm or mixed light thereof, or Ar laser having an emission line in the visible region) and heat-ray laser, directly or via a mask film to form a desired pattern (image) on the film; and (3) developing the resist film to form a resist pattern on the substrate.

These steps will be described in terms of, for example, a substrate in a copper-coated laminate for a printed circuit having a non-penetrating hole and/or a through hole.

In step (1), a liquid positive sensitive resin composition may be applied to a substrate by an appropriate application technique such as a roller, a roll coater, a spin coater, a curtain roll coater, spraying, electrostatic coating, dip coating, silk printing and electrodeposition, and then, after setting as necessary, it may be heated to give a resist film.

Heating may be conducted under a temperature condition which may substantially initiate a crosslinking reaction between the copolymer and the ether-bond-containing unsaturated compound, e.g., at about 60° C. to about 150° C. for about 1 to about 30 minutes.

In step (2), an active energy beam may be irradiated by an appropriate technique such as irradiation via a photomask or direct drawing by laser scanning.

An ultraviolet-ray source may be selected from conventionally used ones such as an extra-high, high, medium or low pressure mercury lamp, a chemical lamp, a carbon arc lamp, a xenon lamp, a metal halide lamp, a fluorescent lamp, a tungsten lamp and solar light, and a variety of lasers.

An ultraviolet-ray dose is generally 0.5 to 2,000 mJ/cm$^2$, preferably 1 to 1,000 mJ/cm$^2$.

Heat rays may be, for example, semiconductor laser (830 nm), YAG laser (1.06 $\mu$m) or infrared ray.

A heat-ray dose is generally 1 to 10,000 mJ/cm$^2$, preferably 10 to 5,000 mJ/cm$^2$.

A visible light source may be a light obtained by cutting UV through a UV blocking filter from a light from a source such as an extra-high, high, medium or low pressure mercury lamp, a chemical lamp, a carbon arc lamp, a xenon lamp, a metal halide lamp, a fluorescent lamp, a tungsten lamp and solar light, and a variety of lasers having an emission line within a visible region of 400 to 700 nm. Among others, a high-power and stable laser beam such as argon laser (emission line: 488 nm, 514.5 nm) and the second harmonic of YAG laser (532 nm) is preferable.

A visible-light dose is generally 0.5 to 2,000 mJ/cm$^2$, preferably 1 to 1,000 mJ/cm$^2$.

The resist film irradiated with an active energy beam is heated preferably under a temperature condition which can cause cleavage of the crosslink structure in the cured film in the presence of an acid generated by the irradiation, e.g., at about 60° C. to about 150° C. for about 1 minute to about 30 minutes.

In step (3), an alkali or organic-solvent developing solution may be used for developing.

Alkali developing solutions which may be used include an aqueous solution of monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, sodium hydroxide, potassium hydroxide, sodium metasilicate, potassium metasilicate, sodium carbonate, tetramethylammonium hydroxide or tetraethylammonium hydroxide.

A concentration of the alkali compound is preferably 0.05 to 10 wt %.

Organic solvents which may be used include hydrocarbons such as hexane, heptane, octane, toluene, xylenes, dichloromethane, chloroform, carbon tetrachloride and trichloroethylene; alcohols such as methanol, ethanol, propanol and butanol; ethers such as diethyl ether, dipropyl ether, dibutyl ether, ethyl vinyl ether, dioxane, propylene oxide, tetrahydrofuran, cellosolve, methyl cellosolve, butyl cellosolve, methylcarbitol and diethylene glycol monoethyl ether; ketones such as acetone, methyl ethyl ketone, methyl isobutyl ketone, isophorone and cyclohexanone; esters such as methyl acetate, ethyl acetate, propyl acetate and butyl acetate; and others such as pyridine, formamide and N,N-dimethylformamide.

Developing may be conducted by spraying a developing solution on the film or immersing it in the solution at a developing-solution temperature of about 10 to 80° C., preferably 15 to 50° C. for about 10 seconds to 60 minutes, preferably 15 seconds to 20 minutes, depending on the type of the resist film used.

The developed resist film is washed with water and dried by, for example, hot air, to form a desired pattern (image) on the substrate. It may be, as necessary, etched to remove an exposed conductive part, and then the resist film may be removed to provide a printed circuit board. For example, when the conductive film on the printed circuit board is copper, the exposed conductive film may be removed with an acidic etchant such as cupric chloride or an ammonia etchant.

After the etching, the remaining resist film may be, as necessary, removed. The remaining resist film may be removed with an aqueous alkali or acid solution or a variety of organic solvents.

A Process for Forming a Pattern Using a Dry Film Resist:

A pattern may be formed by a process consisting essentially of the steps of:

(1) applying the above positive sensitive resin composition to a supporting substrate surface to form a positive dry film comprising a solid positive sensitive resin film;

(2) sticking the dry film on a substrate surface to be stuck in a manner that the substrate surface faces the resin film of the dry film;

(3) irradiating the dry film surface with an active energy beam directly or via a mask film with or without peeling off the supporting substrate of the dry film, to form a desired pattern; and (4) developing the resist film, after peeling off the supporting substrate when it has not been removed in the step (3), to form a resist pattern on the substrate.

This process will be described in terms of, for example, a substrate in a copper-coated laminate for a printed circuit having a non-penetrating hole and/or a through hole.

Sticking in step (2) may be conducted by superposing the film on the substrate surface to be stuck in a manner that the substrate surface (e.g., a conductive substrate surface having a non-penetrating hole and/or a through hole) faces the positive sensitive resin film surface of the dry film, and then thermally laminating them while pressing them on the side of the supporting substrate surface of the dry film to stick the substrate surface and the resin film layer surface together. Thermal lamination may be conducted by, for example, heating the substrate surface and/or heating it from the side of the supporting substrate surface of the dry film. A heating temperature is generally 60 to 150° C., particularly 80 to 120° C.

In sticking the dry film on the substrate surface, the substrate surface may be treated with a liquid such as an adhesion promoting solution described in U.S. Pat. No. 3,645,772 to Jones or a solvent for a resist layer described by Fickes, or a swelling agent, to improve adhesiveness of the substrate surface to the dry film. A vacuum laminating apparatus may be used for adhesion. When using UV or visible light, the liquid may be photosensitive as disclosed in U.S. Pat. No. 3,629,036 to Jsaacson.

Heating may be conducted under a temperature condition which may substantially initiate a crosslinking reaction between the copolymer and the ether-bond-containing unsaturated compound, e.g., at about 60° C. to about 150° C. for about 1 to about 30 minutes.

In step (3), the supporting substrate layer of the dry film is peeled off from the positive sensitive resin film layer. This operation may be conducted after irradiation with an active energy beam described below.

Then, the substrate is irradiated with an active energy beam directly or via mask film to provide a desired pattern (image). The active energy beam may be selected from those described above. Its dose and irradiation procedure may be as described above.

The substrate irradiated with an active energy beam is heated preferably under a temperature condition which can cause cleavage of the crosslink structure in the cured film in the presence of an acid generated by the irradiation, e.g., at about 60° C. to about 150° C. for about 1 to 30 minutes.

The substrate is developed, after peeling off the supporting substrate when it has not been removed, to form a resist pattern on the substrate. Developing may be conducted using the processing solution described above under the conditions described above.

As described for pattern forming for a liquid resist, after the above steps, the substrate may be, as necessary, etched to remove the exposed conductive part, and then, the resist film may be removed to provide a printed circuit board.

After the above etching step, the remaining resist film may be, as necessary, removed.

Thus, the process for forming a resist pattern may provide a printed circuit board on which a good fine-line circuit pattern is formed, using a copper-coated laminate substrate for a printed circuit having a through hole and/or a non-penetrating hole as a substrate, without melting copper inside a through hole, if present, which may cause disconnection. Furthermore, since the through hole, the non-penetrating hole and the fine-line circuit pattern of the printed circuit board are adequately coated with a resist film, a solder resist insulating film may be provided, which is extremely reliable in electric insulation and chemical resistance.

This invention will be specifically described with reference to Examples. They are, however, only descriptive, and thus should not be interpreted to be restrictive in any manner.

EXAMPLE 1

Into a 1,000 mL (inner volume) four-necked flask equipped with an agitator, a thermometer, a condenser and a 500 mL (inner volume) dropping funnel was charged 200 mL of tetrahydrofuran, which was then refluxed with stirring by heating at an external temperature of 80° C. with a water bath. Into a separate 1,000 mL Erlenmeyer flask were charged 134.2 g of 4-(1-methylethenyl)phenol (hereinafter, referred to as "PIPE") (1.00 mol) purified by crystallization from its 2-ethylhexanol solution, 143.8 g of methyl acrylate (1.67 mol) purified by distillation, 48.3 g of acrylic acid (0.67 mol), 16.4 g azobisisobutyronitrile (0.10 mol) as a radical-polymerization initiator and 200 mL of tetrahydrofuran as a solvent.

The latter mixture was stirred until it became a solution. The whole solution was transferred in the dropping funnel in two portions, and was added dropwise in the above four-necked flask in such a rate that refluxing was maintained. During the polymerization reaction, the internal temperature rose from 72° C. at the beginning to 80° C. after 8 hours. Continuing stirring, the water bath was removed and the reaction mixture was allowed to be cooled to room temperature (25° C.) over 2 hours. The polymerization solution was poured into 2 L of n-hexane in a 5 L beaker, to precipitate a product polymer. The precipitated polymer was separated by filtration and again dissolved in 400 mL of tetrahydrofuran. The solution was poured into 2 L of n-hexane to precipitate a solid. This procedure of filtration, separation and precipitation were further repeated twice. At the end of the last filtration-separation, the solid was dried under a reduced pressure of 100 mmHg at 100° C. for 2 hours to give 320.4 g of white polymer.

Figure 2:
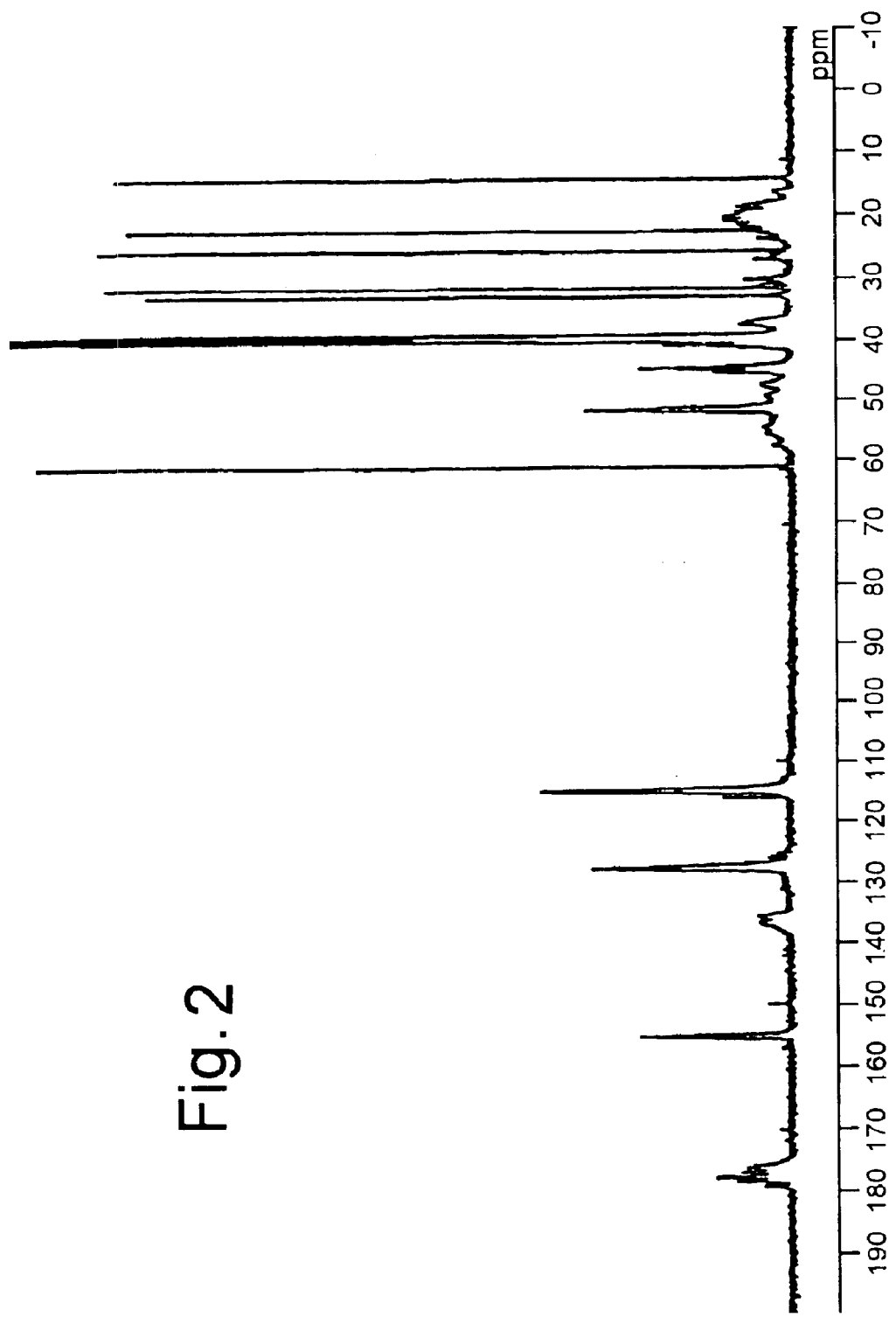
FIG. 2 shows a $^{13}$C-NMR spectrum of the copolymer of 4-(1-methylethenyl)phenol, methyl acrylate and acrylic acid prepared in Example 1, in $d_6$-dimethylsulfoxide.
Figure 3:
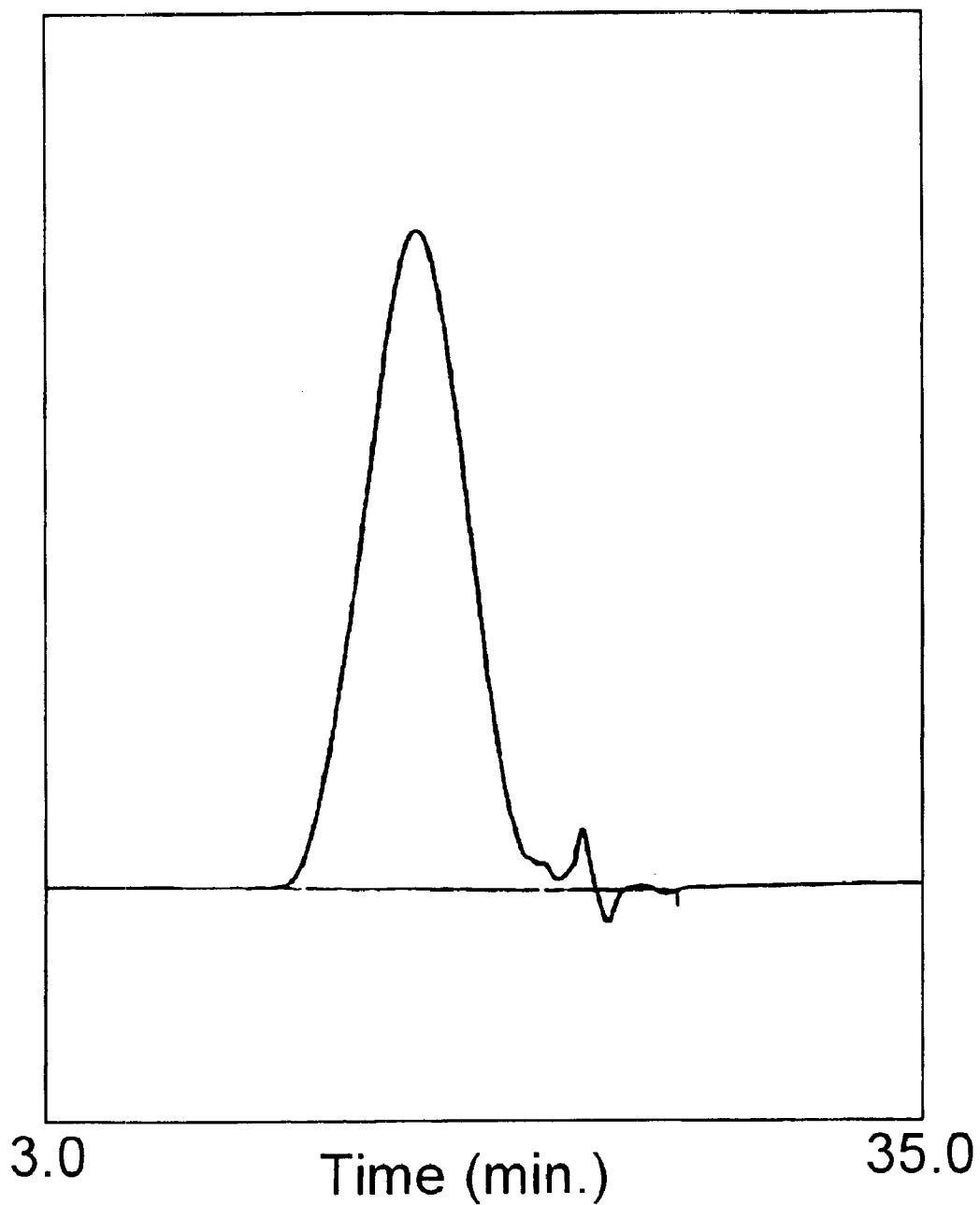
FIG. 3 shows a GPC elution curve for the copolymer of 4-(1-methylethenyl)phenol, methyl acrylate and acrylic acid prepared in Example 1.

The results of $^1$H-NMR, $^{13}$C-NMR and elementary analysis for the white polymer indicated that the polymer is a desired copolymer. FIGS. 1 and 2 show $^1$H-NMR and $^{13}$C-NMR spectra, respectively, for the copolymer in $d_6$-dimethyl sulfoxide. These NMR results showed that the composition ratios a, b and c of the structural units represented by formulas (1), (2) and (3) were 0.34, 0.48 and 0.18, respectively, which were substantially equal to the charging ratios for the starting materials. GPC analysis using polystyrene as a standard indicated that the weight-average molecular weight (Mw) was 10,000 and the molecular-weight dispersion (Mw/Mn) was 1.94. FIG. 3 shows the GPC analysis.

It was attempted to dissolve the copolymer in diethylene glycol dimethyl ether or 2-heptanone, and in both solvents, at least 50% of the copolymer were dissolved.

Figure 4:
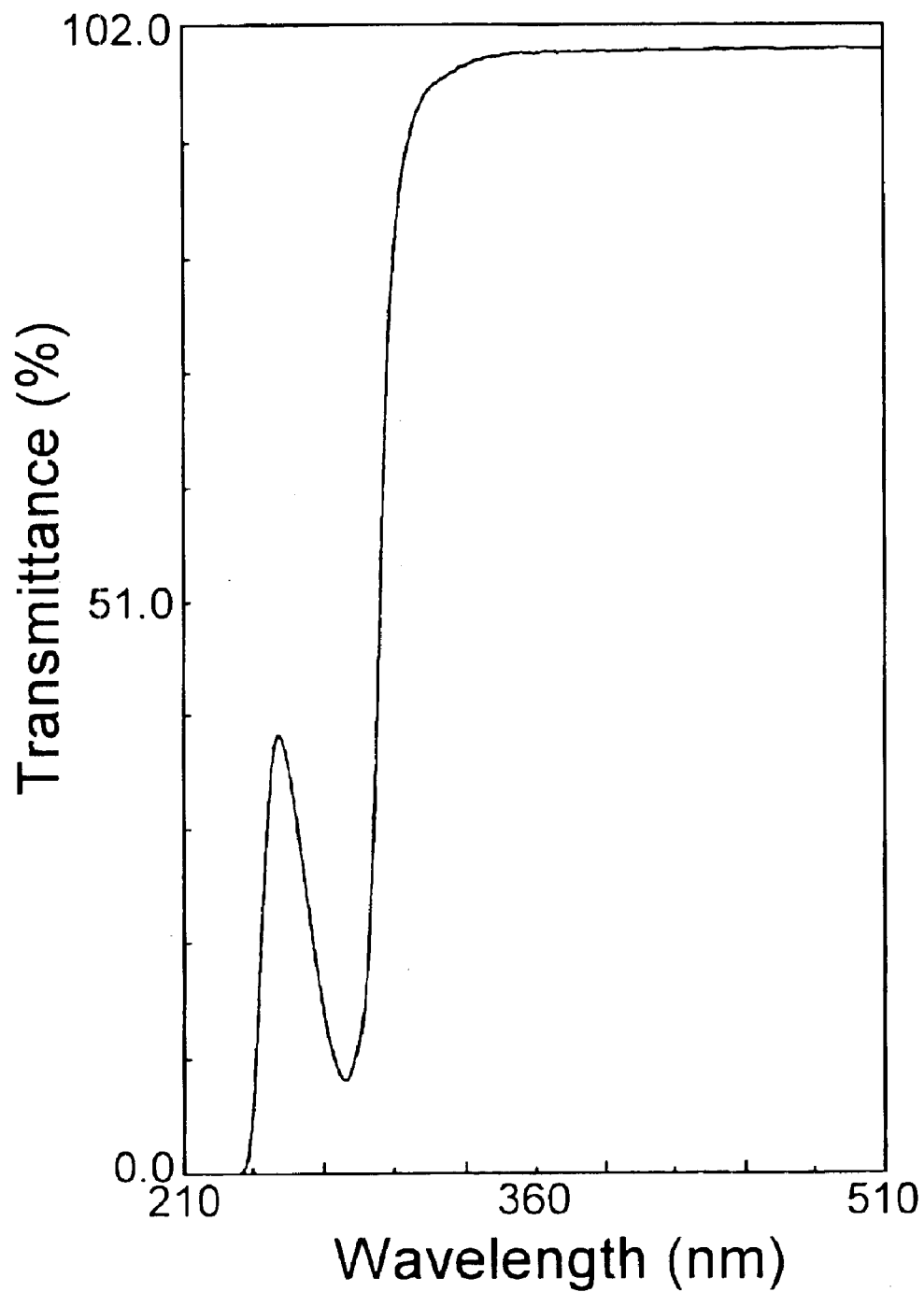
FIG. 4 shows spectrophotometry for ultraviolet and visible region for the copolymer of 4-(1-methylethenyl)phenol, methyl acrylate and acrylic acid prepared in Example 1.

The copolymer was dissolved in diethylene glycol dimethyl ether. The solution was applied on a quartz substrate with a spin coater in an amount giving a dry film thickness of 1 μm. It was heated at 120° C. for 10 minutes to form a film. Its transmittance at 350 nm determined with a spectrophotometer for ultraviolet and visible region was 98% or higher. FIG. 4 shows the spectrochemical analysis in ultraviolet and visible region.

Figure 5:
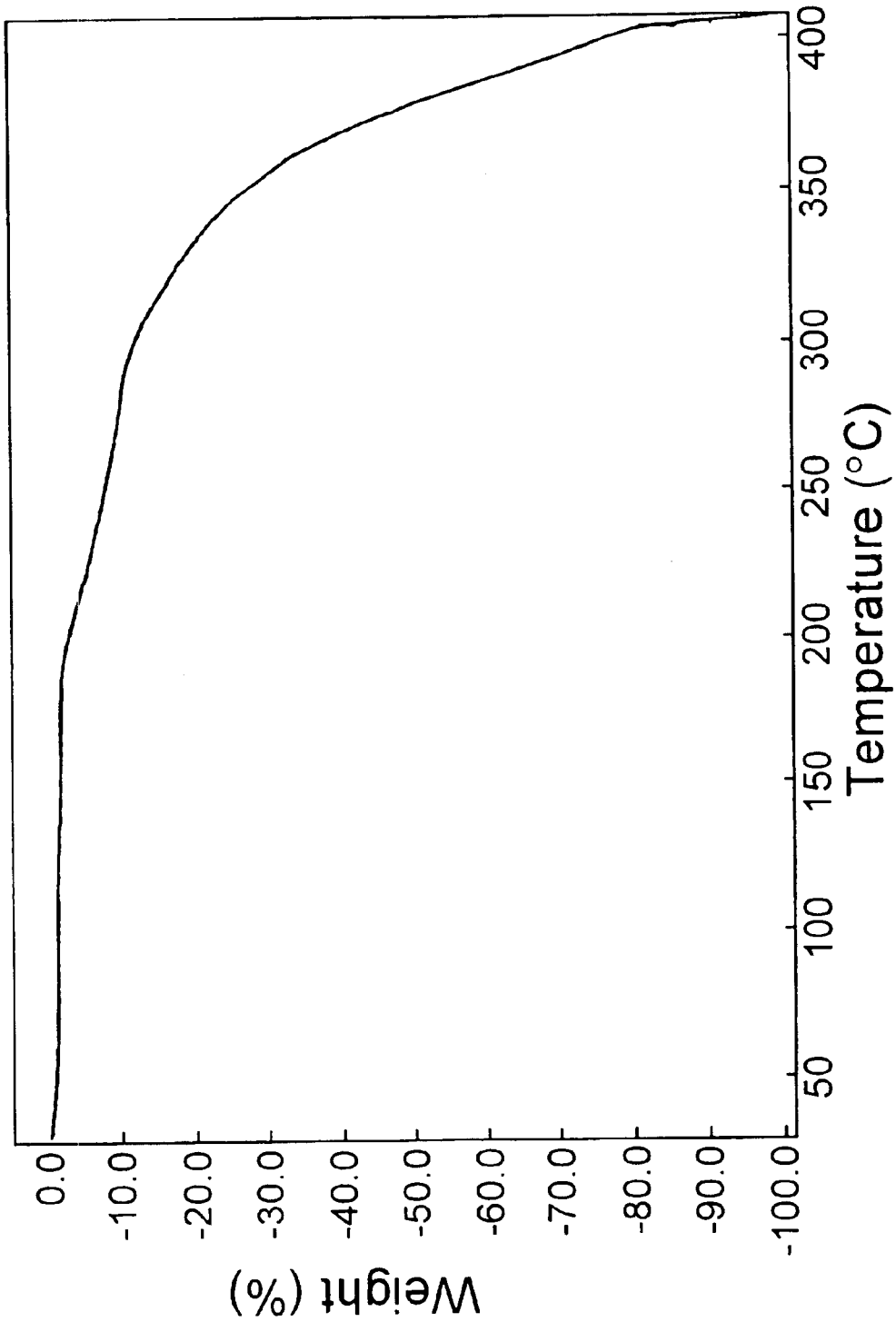
FIG. 5 shows thermogravimetry for the copolymer of 4-(1-methylethenyl)phenol, methyl acrylate and acrylic acid prepared in Example 1.

Its glass transition temperature determined with a differential scanning calorimeter was 125° C. It was found stable up to 200° C. or higher based on thermal stability determined with a differential thermal balance. FIG. 5 shows the thermogravimetric analysis.

In diethylene glycol dimethyl ether solvent were dissolved 100 g of the copolymer (solid), 60 g of a divinyl ether compound (a condensation product of 1 mol of bisphenol A with 2 mol of 2-chloroethyl vinyl ether) and 10 g of a photo acid-generating agent A represented by the following structural formula:

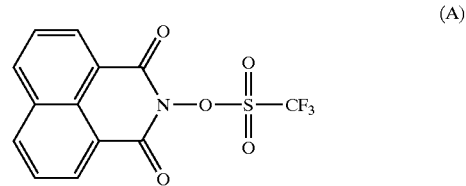

(A)

to provide a 50 wt % organic-solvent resist solution of Example 1.

The organic-solvent resist solution was roller-coated on a copper-coated laminate in an amount giving a dry film thickness of 6 μm and was cured by heating at 120° C. for 8 minutes to form a resist film. The substrate was irradiated with a beam from a high-pressure mercury lamp with a power of 100 mJ/cm² via a positive pattern mask (line/space=50/100 μm), and then was heated at 120° C. for 10 minutes.

The substrate was immersed in an alkali developing solution a, i.e., a 2.38 wt % aqueous solution of tetrahydroammonium hydroxide, at 25° C. for 60 seconds for developing and removing the resist film in the exposed part. A line/space was as good as 50/100 μm.

The substrate was irradiated with an UV laser with a power of 100 mJ/cm² instead of a high-pressure mercury lamp via a positive pattern mask, giving a line/space of 50/100 μm. Then, it was developed with an alkali solution as described above.

Then, the exposed copper film on the substrate was etched with a solution of cupric chloride at about 40° C. and the resist film was peeled off with a 3% aqueous solution of sodium hydroxide to provide a printed circuit board. The printed circuit had a good line/space of 50/100 μm.

EXAMPLES 2 to 4

Reaction, work up, mixing and resist-film formation were conducted as described in Example 1, except that PIPE, methyl acrylate and acrylic acid were charged in the amounts shown in Table 1 although the total molar amount was the same as that in Example 1 (3.34 mol).

For a resulting copolymer, composition ratios, a yield, a weight-average molecular weight and molecular weight dispersion were determined as described in Example 1. It was evaluated for solvent solubility, a transparency, thermal stability and resist-film performance (line/space) as described in Example 1. The results of these analyses and evaluation are shown in Table 1 together with the results for Example 1. A printed circuit board was fabricated as described in Example 1.

COMPARATIVE EXAMPLE 1

Reaction, workup, analyses, mixing, resist-film formation and evaluation were conducted as described in Example 1, except that 223.8 g of PIPE (1.67 mol) and 143.8 g of methyl acrylate (1.67 mol) were charged and acrylic acid was not used. Charging mole fractions, the results of analyses for a product copolymer and evaluation for resist-film performance are shown in Table 1 together with the results for Examples 1 to 4. A printed circuit board was fabricated as described in Example 1.

COMPARATIVE EXAMPLE 2

Reaction, workup, analyses, mixing, resist-film formation and evaluation were conducted as described in Example 1, except that 223.8 g of PIPE (1.67 mol) and 120.4 g of acrylic acid (1.67 mol) were charged and methyl acrylate was not used. Charging mole fractions, the results of analyses for a product copolymer and evaluation for resist-film performance are shown in Table 1 together with the results for Examples 1 to 4 and Comparative Example 1. A printed circuit board was fabricated as described in Example 1.

COMPARATIVE EXAMPLE 3

Reaction, workup, analyses, mixing, resist-film formation and evaluation were conducted as described in Example 1, except that 143.8 g of methyl acrylate (1.67 mol) and 120.4 g of acrylic acid (1.67 mol) were charged and PIPE was not used. Charging mole fractions, the results of analyses for a product copolymer and evaluation for resist-film performance are shown in Table 1 together with the results for Examples 1 to 4 and Comparative Examples 1 and 2. A printed circuit board was fabricated as described in Example 1.

TABLE 1

| Example | Polymerization (Upper: charging ratio; Lower: composition ratio) | | | Polymerization results | | | | | | |
|---|---|---|---|---|---|---|---|---|---|---|
| | PIPE a | Methyl acrylate b | Acrylic acid c | Yield (g) | Mw | Mw/Mn | Solvent solubility (wt %) | Line/space (μm/μm) | Transparency (%/μm) | Thermal stability (° C.) |
| 1 | 0.30 | 0.50 | 0.20 | 320.4 | 10,000 | 1.94 | >50 | 50/100 | >98 | >200 |
| | 0.34 | 0.48 | 0.18 | | | | | | | |
| 2 | 0.20 | 0.65 | 0.15 | 321.1 | 9,500 | 1.78 | >50 | 50/100 | >98 | >200 |
| | 0.24 | 0.62 | 0.14 | | | | | | | |
| 3 | 0.40 | 0.40 | 0.20 | 324.3 | 9,800 | 1.85 | >50 | 50/100 | >98 | >200 |
| | 0.43 | 0.38 | 0.19 | | | | | | | |
| 4 | 0.30 | 0.40 | 0.30 | 319.0 | 9,900 | 1.91 | >50 | 50/100 | >98 | >200 |
| | 0.33 | 0.39 | 0.28 | | | | | | | |
| Comp. Example 1 | 0.50 | 0.50 | — | 355.7 | 10,100 | 1.95 | >50 | Could not form a pattern | >98 | >200 |
| Comp. Example 2 | 0.50 | — | 0.50 | 337.2 | 10,500 | 1.98 | 5 | Could not form a pattern | >98 | >200 |
| Comp. Example 3 | — | 0.50 | 0.50 | 257.4 | 12,200 | 2.05 | 15 | Could not form a pattern | >98 | |

EXAMPLES 5 to 8

Reaction, workup, analyses, mixing, resist-film formation and evaluation were conducted as described in Example 1, except that methyl acrylate was replaced with one of acrylates in Table 2 in a mole fraction shown in Table 2. The results of analyses for product copolymers and evaluation for resist-film performance are shown in Table 2 together with the results for Example 1. A printed circuit board was fabricated as described in Example 1.

COMPARATIVE EXAMPLE 4

Reaction, workup, analyses, resist-film formation and evaluation were conducted as described in Example 1, except that 223.8 g of PIPE (1.67 mol) was charged, methyl acrylate was replaced with 213.8 g of tert-butyl acrylate (1.67 mol) and acrylic acid was not used. The results of analyses for a product copolymer and evaluation for resist-film performance are shown in Table 2 together with the results for Examples 1 and 5 to 8. A printed circuit board was fabricated as described in Example 1.

TABLE 2

| Exam. | Polymerization(Upper: charging ratio; Lower: composition ratio) | | | | Polymerization results | | | | | | |
|---|---|---|---|---|---|---|---|---|---|---|---|
| | PIPE a | (Meth)acrylates Name | b | Acrylic acid c | Yield (gram) | Mw | Mw/Mn | Solvent solubility (wt %) | Line/space (μm/μm) | Transparency (%/μm) | Thermal stability (° C.) |
| 1 | 0.30 0.34 | Methyl acrylate | 0.50 0.48 | 0.20 0.18 | 320.4 | 10,000 | 1.94 | >50 | 50/100 | >98 | >200 |
| 5 | 0.30 0.33 | Methyl methacrylate | 0.50 0.51 | 0.20 0.16 | 338.6 | 9,800 | 1.88 | >50 | 50/100 | >98 | >200 |
| 6 | 0.30 0.34 | 2-Hydroxyethyl acrylate | 0.50 0.47 | 0.20 0.19 | 350.1 | 9,900 | 1.95 | >50 | 50/100 | >98 | >200 |
| 7 | 0.30 0.32 | Ethyl acrylate Methyl methacrylate | 0.50 0.46 | 0.20 0.22 | 332.0 | 9,300 | 1.75 | >50 | 50/100 | >98 | >200 |
| 8 | 0.30 0.35 | n-Butyl acrylate Methyl methacrylate | 0.50 0.47 | 0.20 0.18 | 345.6 | 9,200 | 1.76 | >50 | 50/100 | >98 | >200 |
| Comp. Exam4 | 0.50 0.54 | t-Butyl acrylate | 0.50 0.46 | 0 0 | 410.7 | 11,000 | 1.98 | >50 | Could not form a pattern | >98 | >200 |

EXAMPLE 9

Into a 1,000 mL (inner volume) four-necked flask equipped with an agitator, a thermometer and a condenser were charged 134.2 g of PIPE (1.00 mol), 143.8 g of methyl acrylate (1.67 mol), 58.3 g of methacrylic acid (0.67 mol), 16.4 g of azobisisobutyronitrile (0.10 mol) and 400 mL of tetrahydrofuran. The mixture was then heated with stirring at an external temperature of 80° C. with a water bath, and then reacted for 8 hours while keeping the temperature. The reaction mixture was worked up as described in Example 1 to give a desired copolymer, for which analyses, resist-film formation and evaluation were conducted as described in Example 1. The results of analyses for the copolymer and evaluation for resist-film performance are shown in Table 3 together with the results for Example 1. A printed circuit board was fabricated as described in Example 1.

EXAMPLES 10 to 13

Reaction, workup, analyses and evaluation were conducted as described in Example 1, except that tetrahydrofuran was replaced with one of the solvents in Table 4 in an amount shown in Table 4 and a reaction temperature and a reaction duration were changed as shown in Table 4. Composition ratios, yields, weight-average molecular weights and molecular-weight dispersions for product copolymers and evaluation results for resist-film performance are shown in Table 4 together with the results for Example 1. These copolymers exhibited good solvent solubility, transparency and thermal stability as was in Example 1. Formation of a resist film and fabrication of a printed circuit board were conducted as described in Example 1.

TABLE 3

| Example | Polymerization(Upper: charging ratio; Lower: composition ratio) | | | | Polymerization results | | | | | | |
|---|---|---|---|---|---|---|---|---|---|---|---|
| | PIPE a | Methyl acrylate b | (Meth)acrylic acids Name | c | Yield (g) | Mw | Mw/Mn | Solvent solubility (wt %) | Line/space (μm/μm) | Transparency (%/μm) | Thermal stability (° C.) |
| 1 | 0.30 0.34 | 0.50 0.48 | Acrylic acid | 0.20 0.18 | 320.4 | 10,000 | 1.94 | >50 | 50/100 | >98 | >200 |
| 9 | 0.30 0.35 | 0.50 0.46 | Methacrylic acid | 0.20 0.19 | 328.2 | 9,500 | 1.79 | >50 | 50/100 | >98 | >200 |

TABLE 4

| | Polymerization(Upper: charging ratio; Lower: composition ratio) | | | | | Polymerization | Polymerization | Polymerization results | | |
|---|---|---|---|---|---|---|---|---|---|---|
| | | Methyl | Acrylic | | | | | | | |
| | PIPE | acrylate | acid | Solvent | | temp. | duration | Yield | | Mw/ | Line/space |
| Exam. | a | b | c | Name | Amount(g) | (° C.) | (hour) | (g) | Mw | Mn | (μm/μm) |
| 1 | 0.30 | 0.50 | 0.20 | Tetrahydrofuran | 400 | 80 | 8 | 320.4 | 10,000 | 1.94 | 50/100 |
| | 0.34 | 0.48 | 0.18 | | | | | | | | |
| 10 | 0.30 | 0.50 | 0.20 | 2-Ethylhexanol | 200 | 100 | 7 | 322.1 | 19,500 | 1.81 | 50/100 |
| | 0.31 | 0.19 | 0.20 | | | | | | | | |
| 11 | 0.30 | 0.50 | 0.20 | n-Butyl alcohol | 600 | 110 | 12 | 319.9 | 7,600 | 1.83 | 50/100 |
| | 0.32 | 0.47 | 0.21 | | | | | | | | |
| 12 | 0.30 | 0.50 | 0.20 | Methyl isobutyl ketone | 180 | 90 | 20 | 318.6 | 21,000 | 2.00 | 50/100 |
| | 0.34 | 0.49 | 0.17 | | | | | | | | |
| 13 | 0.30 | 0.50 | 0.20 | Diethylene glycol dimethyl ether | 250 | 100 | 22 | 314.1 | 14,000 | 1.99 | 50/100 |
| | 0.33 | 0.48 | 0.19 | | | | | | | | |

EXAMPLES 14 to 18

Reaction, workup, analyses, mixing, resist-film formation and evaluation were conducted as described in Example 1, except that azobisisobutyronitrile was replaced with one of the radical-polymerization initiators in Table 5 in an amount shown in Table 5 and a reaction temperature and a reaction duration were changed as shown in Table 5. Composition ratios, yields, weight-average molecular weights and molecular-weight dispersions for product copolymers and evaluation results for resist-film performance are shown in Table 5 together with the results for Example 1. These copolymers exhibited good solvent solubility, transparency and thermal stability as was in Example 1. Formation of a resist film and fabrication of a printed circuit board were conducted as described in Example 1.

in water to prepare an aqueous resist solution of one of Examples 19 to 37, giving a solid proportion of 20 wt %. Examples 19 to 37 sequentially correspond to Examples 1 to 18; for example, Example 19 to Example 1, Example 20 to Example 2, and so forth.

A pattern was formed and a substrate thus obtained was evaluated for its performance (line/space) as described in Example 1, using a resist film prepared by anionic-electrodepositing a film 5 μm of dry thickness on a copper-coated laminate substrate as an anode using each aqueous resist solution of Examples 19 to 37 as an electrodeposition bath, washing it with water and curing it by heating at 120° C. for 8 minutes, instead of a resist film in Example 1 prepared by roller-coating an organic-solvent resist solution on a copper-coated laminate in an amount giving a dry film thickness of 6 μm and curing it by heating at 120° C. for 8

TABLE 5

| | Polymerization(Upper: charging ratio; Lower: composition ratio) | | | | | Polymerization | Polymerization | Polymerization results | | | |
|---|---|---|---|---|---|---|---|---|---|---|---|
| | | Methyl | Acrylic | Radical-polymerization | | | | | | | |
| | | acrylate | acid | initiator | | temp. | duration | | | | Line/space |
| Exam. | PIPE a | b | C | Name | Amount(g) | (° C.) | (hour) | Yield (g) | Mw | Mw/Mn | (μm/μm) |
| 1 | 0.30 | 0.50 | 0.20 | Azobisisobutyro-nitrile | 16.4 | 80 | 8 | 320.4 | 10,000 | 1.94 | 50/100 |
| | 0.34 | 0.48 | 0.18 | | | | | | | | |
| 14 | 0.30 | 0.50 | 0.20 | Dimethyl azobisisobutyrate | 35.7 | 120 | 5 | 320.9 | 6,800 | 1.81 | 50/100 |
| | 0.33 | 0.49 | 0.18 | | | | | | | | |
| 15 | 0.30 | 0.50 | 0.20 | Azobiscyclohexane-carbonitrile | 24.4 | 140 | 15 | 313.7 | 9,600 | 1.83 | 50/100 |
| | 0.31 | 0.47 | 0.22 | | | | | | | | |
| 16 | 0.30 | 0.50 | 0.20 | Benzoyl peroxide | 12.0 | 100 | 20 | 315.6 | 25,000 | 2.00 | 50/100 |
| | 0.35 | 0.50 | 0.15 | | | | | | | | |
| 17 | 0.30 | 0.50 | 0.20 | Di-t-butyl peroxide | 14.4 | 160 | 10 | 311.1 | 10,000 | 1.99 | 50/100 |
| | 0.33 | 0.47 | 0.20 | | | | | | | | |
| 18 | 0.30 | 0.50 | 0.20 | Peroxydiisopropyl dicarbonate | 20.6 | 60 | 7 | 318.3 | 9,100 | 1.76 | 50/100 |
| | 0.36 | 0.47 | 0.17 | | | | | | | | |

EXAMPLES 19 to 37

Each copolymer powder obtained in Examples 1 to 18 was dissolved in diethylene glycol dimethyl ether to prepare a 50 wt % solution. To the solution were added 60 g of the divinyl ether compound (a condensation product of 1 mol of bisphenol A with 2 mol of 2-chloroethyl vinyl ether), 10 g of the photo acid-generating agent A and triethylamine (0.8 mol per one carboxyl group in the copolymer), per 100 g of the solid in the solution, and then the mixture was dispersed minutes. All the substrates exhibited a line/space as good as 50 μm/100 μm.

EXAMPLES 38 to 56

An organic-solvent resist solution prepared in each of Examples 1 to 18 was applied with a bar coater to a polyethylene terephthalate film in an amount giving a dry thickness of 10 μm, and then the film was heated at 120° C. for 10 minutes to give a dry film.

The dry film was applied on a copper-coated laminate using a dry-film laminator and the polyethylene terephthalate film was peeled off to provide a resist-film coated substrate. Then, the substrate was subject to irradiation, developing, etching and film-peeling as described in Example 1 to give a printed circuit board. For the board, a pattern was formed and performance (line/space) was evaluated as described in Example 1. All the board exhibited a line/space as good as 50 μm/100 μm.

EXAMPLE 57

The organic-solvent resist solution was roller-applied to a copper-coated laminate in an amount giving a dry film thickness of 6 μm as described in Example 1 and then was cured by heating at 120° C. for 8 minutes to give a resist film. It was irradiated with heat ray (wavelength: 839 nm, semiconductor laser, 1 J/cm$^2$) over the resist film surface, giving a line/space of 50 μm/100 μm.

The substrate was immersed in an alkali developing solution a, at 25° C. for 60 seconds for developing and removing the resist film in the exposed part as described in Example 1. A resist pattern with a line/space of 50/100 mm was formed. Thus, its resist performance was good.

Then, the substrate was etched with a solution of cupric chloride at about 40° C. and the resist film was peeled off with a 3% aqueous solution of sodium hydroxide to provide a printed circuit board. The printed circuit had a line/space of 50/100 μm, that is, a good wiring pattern could be formed.

EXAMPLES 58 to 114

A resist pattern was formed as described in each of Examples 2 to 56, except that UV irradiation was replaced with heat-ray irradiation described in Example 57. All substrates exhibited good resist performance, i.e., a line/space=50 μm/100 μm.

COMPARATIVE EXAMPLES 5 to 8

Resist-pattern formation was attempted as described in each of Comparative Examples 1 to 4, except that UV irradiation was replaced with heat-ray irradiation described in Example 57. For any substrate, a pattern could not be formed.

EXAMPLE 115

In diethylene glycol dimethyl ether solvent were dissolved 100 g of the copolymer (solid) obtained in Example 1, 60 g of a divinyl ether compound (a condensation product of 1 mol of bisphenol A with 2 mol of 2-chloroethyl vinyl ether), 10 g of the above photo acid-generating agent A and 1.5 g of a photosensitizing dye B represented by the following structural formula:

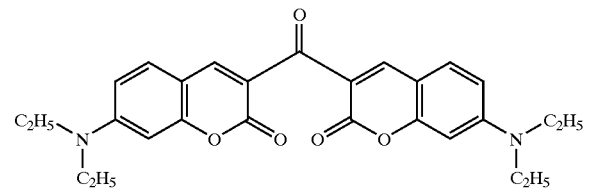

(B)

to provide a 50 wt % organic-solvent resist solution.

The organic-solvent resist solution was roller-applied to a copper-coated laminate in an amount giving a dry film thickness of 6 μm and then was cured by heating at 120° C. for 8 minutes to give a resist film. The substrate was irradiated with argon laser (wavelength: 488 nm) with a power of 5 mJ/cm$^2$, giving a line/space of 50 μm/100 μm. Then, it was heated at 120° C. for 10 minutes.

The substrate was immersed in an alkali developing solution a, at 25° C. for 60 seconds for developing and removing the resist film in the exposed part as described in Example 1. A resist pattern with a line/space of 50/100 mm was formed. Thus, its resist performance was good.

Then, the substrate was etched with a solution of cupric chloride at about 40° C. and the resist film was peeled off with a 3% aqueous solution of sodium hydroxide to provide a printed circuit board. The printed circuit had a line/space of 50/100 μm, that is, a good wiring pattern could be formed.

EXAMPLES 116 to 172

A resist pattern was formed as described in each of Examples 2 to 56, except that the same amount of the photosensitizing dye B described in Example 115 was added in a composition and UV irradiation was replaced with argon-laser irradiation described in Example 115. All substrates exhibited good resist performance, i.e., a line/space= 50 μm/100 μm.

COMPARATIVE EXAMPLES 9 to 12

Resist-pattern formation was attempted as described in each of Comparative Examples 1 to 4, except that the same amount of the photosensitizing dye B described in Example 115 was added in a composition and UV irradiation was replaced with argon-laser irradiation described in Example 115. For any substrate, a pattern could not be formed.

What is claimed is:

1. A positive ultraviolet sensitive resist, a portion of which when subsequently irradiated with ultraviolet rays is soluble or dispersible in an organic solvent or an aqueous developing solution, and whose unirradiated portion is substantially insoluble and undispersible in an organic solvent or an aqueous developing solution, said resist obtained by heating a composition comprising a base polymer, an ether-bond-containing olefinic unsaturated compound and an acid-generating agent, where the base polymer is a copolymer comprising the structural units represented by formula (1):

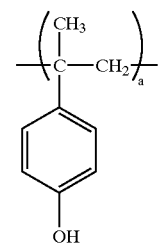

(1)

formula (2):

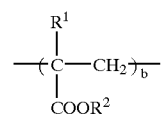

(2)

where R$^1$ is hydrogen or methyl and R$^2$ is C$_1$–C$_6$ straight or branched unsubstituted alkyl or C$_1$–C$_6$ straight or branched substituted alkyl, and formula (3):

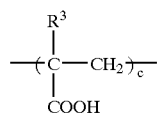

(3)

where R³ is hydrogen or methyl,
wherein a, b and c are 0.05 to 0.7, 0.15 to 0.8 and 0.01 to 0.5, respectively and a+b+c=1.

2. The positive ultraviolet sensitive resist claimed in claim 1, where a compounding ratio of the copolymer comprising the structural units represented by formulas (1) to (3) and the ether-bond-containing olefinic unsaturated compound is 0.5 to 50/99.5 to 50 wt % as a ratio of copolymer/unsaturated compound based on their total wt % values, and the amount of the acid-generating agent is 0.1 to 40 wt parts to 100 wt parts of the total amount of the copolymer and the olefinic unsaturated compound.

3. The positive ultraviolet sensitive resist claimed in claim 1, where R² in the structural unit represented by formula (2) is $C_1$–$C_6$ straight or branched unsubstituted alkyl or $C_1$–$C_6$ straight or branched hydroxylated alkyl.

4. The positive ultraviolet sensitive resist claimed in claim 3, where R² in the structural unit represented by formula (2) is selected from the group consisting of methyl, ethyl, n-propyl, isopropyl, n-butyl, isobutyl, sec-butyl and 2-hydroxyethyl.

5. The positive ultraviolet sensitive resist claimed in claim 1 where a material giving the structural unit represented by formula (2) is a (meth)acrylate selected from the group consisting of methyl acrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butyl methacrylate, isobutyl methacrylate, sec-butyl methacrylate and 2-hydroxyethyl methacrylate.

6. The positive ultraviolet sensitive resist claimed in claim 1 where for the copolymer, a in formula (1) is 0.20 to 0.45, b in formula (2) is 0.25 to 0.70, and c in formula (3) is 0.15 to 0.40, and a+b+c=1.

7. The positive ultraviolet sensitive resist claimed in claim 1 where the copolymer comprising the structural units represented formulas (1), (2) and (3) is an alternating copolymer comprising the structural units represented by formula (4):

(4)

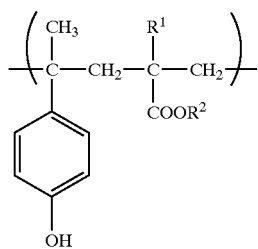

where R¹ is hydrogen or methyl and R² is $C_1$–$C_6$ straight or branched unsubstituted alkyl or $C_1$–$C_6$ straight or branched substituted alkyl, and formula (5):

(5)

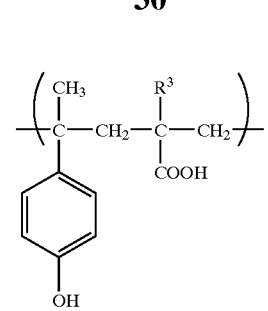

where R³ is hydrogen or methyl, in which the total content of these structural units is at least 60 mol %.

8. A positive thermally sensitive resist, a portion of which when subsequently irradiated with heat rays is soluble or dispersible in an organic solvent or an aqueous developing solution, and whose unirradiated portion is substantially insoluble and undispersible in an organic solvent or an aqueous developing solution, said resist obtained by heating a composition comprising a base polymer, an ether-bond-containing olefinic unsaturated compound and an acid-generating agent, where the base polymer is a copolymer comprising the structural units represented by formula (1):

(1)

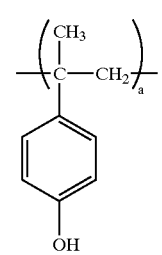

formula (2):

(2)

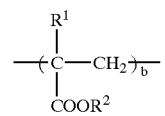

where R¹ is hydrogen or methyl and R² is $C_1$–$C_6$ straight or branched unsubstituted alkyl or $C_1$–$C_6$ straight or branched substituted alkyl, and formula (3):

(3)

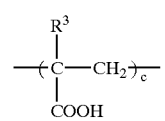

where R³ is hydrogen or methyl,
wherein a, b and c are 0.05 to 0.7, 0.15 to 0.8 and 0.01 to 0.5, respectively and a+b+c=1.

9. The positive thermally sensitive resist claimed in claim 8 where a compounding ratio of the copolymer comprising the structural units represented by formulas (1) to (3) and the ether-bond-containing olefinic unsaturated compound is 0.5 to 50/99.5 to 50 wt % as a ratio of copolymer/unsaturated compound based on their total wt % values, and the amount of the acid-generating agent is 0.1 to 40 wt parts to 100 wt parts of the total amount of the copolymer and the olefinic unsaturated compound.

10. The positive thermally sensitive resist claimed in claim 8 where $R^2$ in the structural unit represented by formula (2) is $C_1-C_6$ straight or branched unsubstituted alkyl or $C_1-C_6$ straight or branched hydroxylated alkyl.

11. The positive thermally sensitive resist claimed in claim 10 where $R^2$ in the structural unit represented by formula (2) is selected from the group consisting of methyl, ethyl, n-propyl, isopropyl, n-butyl, isobutyl, sec-butyl and 2-hydroxyethyl.

12. The positive thermally sensitive resist claimed in claim 8 where a material giving the structural unit represented by formula (2) is a (meth)acrylate selected from the group consisting of methyl acrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butyl methacrylate, isobutyl methacrylate, sec-butyl methacrylate and 2-hydroxyethyl methacrylate.

13. The positive thermally sensitive resist claimed in claim 8 where for the copolymer, a in formula (1) is 0.20 to 0.45, b in formula (2) is 0.25 to 0.70, and c in formula (3) is 0.15 to 0.40, and a+b+c=1.

14. The positive thermally sensitive resist claimed in claim 8 where the copolymer comprising the structural units represented formulas (1), (2) and (3) is an alternating copolymer comprising the structural units represented by formula (4):

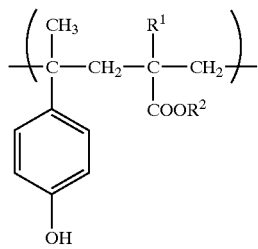

(4)

where $R^1$ is hydrogen or methyl and $R^2$ is $C_1-C_6$ straight or branched unsubstituted alkyl or $C_1-C_6$ straight or branched substituted alkyl, an formula (5):

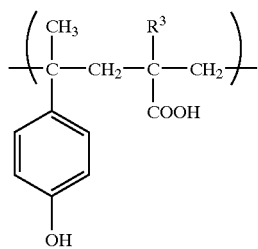

(5)

where $R^3$ is hydrogen or methyl, in which the total content of these structural units is at least 60 mol %.

15. A positive visible-light sensitive resist, a portion of which when subsequently irradiated with visible light is soluble or dispersible in an organic solvent or an aqueous developing solution, and whose unirradiated portion is substantially insoluble and undispersible in an organic solvent or an aqueous developing solution, said resist obtained by heating a composition comprising a photosensitizer and a composition comprising a base polymer, an ether-bond-containing olefinic unsaturated compound and an acid-generating agent, where the base polymer is a copolymer comprising the structural units represented by formula (1):

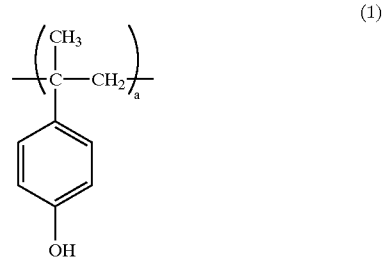

(1)

formula (2):

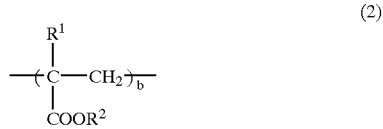

(2)

where $R^1$ is hydrogen or methyl and $R^2$ is $C_1-C_6$ straight or branched unsubstituted alkyl or $C_1-C_6$ straight or branched substituted alkyl, and formula (3):

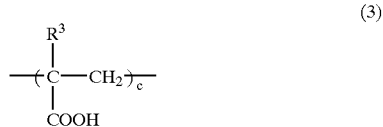

(3)

where $R^3$ is hydrogen or methyl,
wherein a, b and c are 0.05 to 0.7, 0.15 to 0.8 and 0.01 to 0.5, respectively and a+b+c=1.

16. The positive visible-light sensitive resist as claimed in claim 15 where a compounding ratio of the copolymer comprising the structural units represented by formulas (1) to (3) and the ether-bond-containing olefinic unsaturated compound is 0.5 to 50/99.5 to 50 wt % as a ratio of copolymer/unsaturated compound based on their total wt % values; the amount of the acid-generating agent is 0.1 to 40 wt parts to 100 wt parts of the total amount of the copolymer and the olefinic unsaturated compound; and the amount of the photosensitizer is 0.1 to 20 wt parts to 100 wt parts of the total amount of the copolymer, the olefinic unsaturated compound and the acid-generating agent.

17. The positive visible-light sensitive resist as claimed in claim 15 where $R^2$ in the structural unit represented by formula (2) is $C_1-C_6$ straight or branched unsubstituted alkyl or $C_1-C_6$ straight or branched hydroxylated alkyl.

18. The positive visible-light sensitive resist as claimed in claim 17 where $R^2$ in the structural unit represented by formula (2) is selected from the group consisting of methyl, ethyl, n-propyl, isopropyl, n-butyl, isobutyl, sec-butyl and 2-hydroxyethyl.

19. The positive visible-light sensitive resist as claimed in claim 15 where a material giving the structural unit represented by formula (2) is a (meth)acrylate selected from the group consisting of methyl acrylate, ethyl acrylate, n-propyl acrylate, isopropyl acrylate, n-butyl acrylate, isobutyl acrylate, sec-butyl acrylate, 2-hydroxyethyl acrylate, methyl methacrylate, ethyl methacrylate, n-propyl methacrylate, isopropyl methacrylate, n-butyl methacrylate, isobutyl methacrylate, sec-butyl methacrylate and 2-hydroxyethyl methacrylate.

20. The positive visible-light sensitive resist as claimed in claim 15 where for the copolymer, a in formula (1) is 0.20 to 0.45, b in formula (2) is 0.25 to 0.70, and c in formula (3) is 0.15 to 0.40, and a+b+c=1.

21. The positive visible-light sensitive resist claimed in claim 15 where the copolymer comprising the structural units represented formulas (1), (2) and (3) is an alternating copolymer comprising the structural units represented by formula (4):

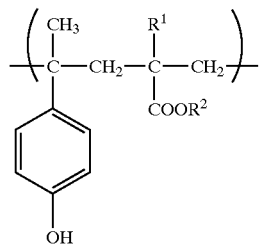

(4)

where $R^1$ is hydrogen or methyl and $R^2$ is $C_1$–$C_6$ straight or branched unsubstituted alkyl or $C_1$–$C_6$ straight or branched substituted alkyl, and formula (5):

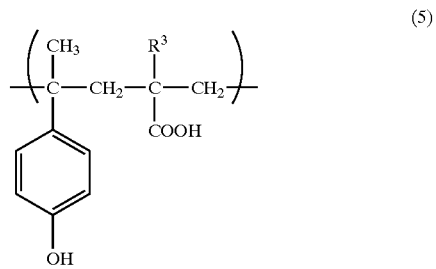

(5)

where $R^3$ is hydrogen or methyl, in which the total content of these structural units is at least 60 mol %.

* * * * *